(12) United States Patent
Ishihama

(10) Patent No.: US 8,030,696 B2
(45) Date of Patent: Oct. 4, 2011

(54) THIN FILM TRANSISTOR SUBSTRATE, DEFECT REPAIRING METHOD THEREFOR, AND DISPLAY DEVICE

(75) Inventor: Yasuyuki Ishihama, Kanagawa (JP)

(73) Assignee: Sony Corporation, Tokyo (JP)

( * ) Notice: Subject to any disclaimer, the term of this patent is extended or adjusted under 35 U.S.C. 154(b) by 259 days.

(21) Appl. No.: 12/320,308

(22) Filed: Jan. 23, 2009

(65) Prior Publication Data

US 2009/0200555 A1 Aug. 13, 2009

(30) Foreign Application Priority Data

Feb. 7, 2008 (JP) ................................ 2008-028089

(51) Int. Cl.
*H01L 27/108* (2006.01)
(52) U.S. Cl. ................ 257/300; 257/E27.093
(58) Field of Classification Search .............. 257/300, 257/359, E27.016, E27.093; 438/171
See application file for complete search history.

(56) References Cited

U.S. PATENT DOCUMENTS 6,822,701 B1  11/2004  Kasahara et al.
7,763,942 B2 *  7/2010  Chen et al. ............... 257/359

FOREIGN PATENT DOCUMENTS

JP  2962932  8/1999
JP  3462792  8/2003

* cited by examiner

*Primary Examiner* — Quoc Hoang
(74) *Attorney, Agent, or Firm* — Rader, Fishman & Grauer PLLC

(57) ABSTRACT

A thin film transistor substrate includes: a substrate; a thin film transistor and a capacitor formed on the substrate; and a protective film for protecting an electrode on a back surface side of the capacitor when an electrode on a front surface side of the capacitor is cut by irradiation with laser light, the protective film being disposed at such a position as to enclose a corner part of the electrode on the front surface side between the electrode on the front surface side and the electrode on the back surface side of the capacitor.

6 Claims, 23 Drawing Sheets

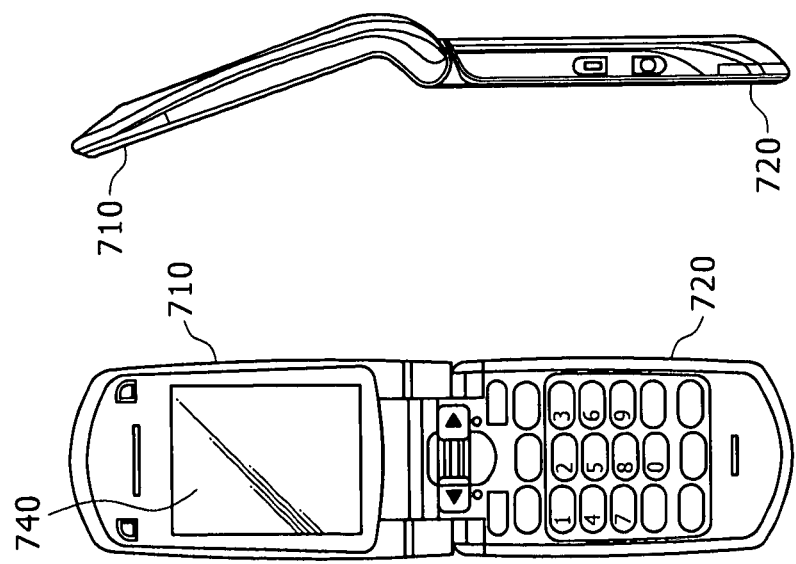
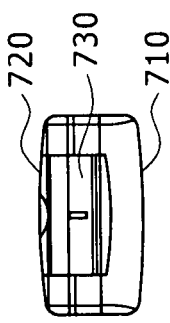
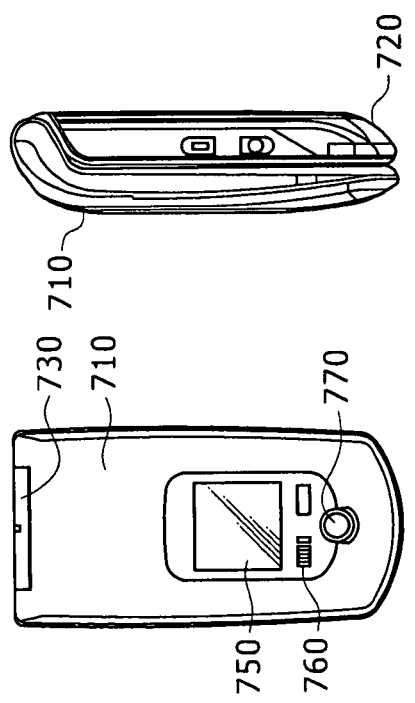
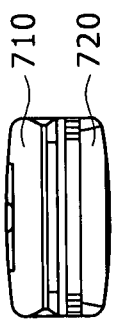

THIN FILM TRANSISTOR SUBSTRATE, DEFECT REPAIRING METHOD THEREFOR, AND DISPLAY DEVICE

CROSS REFERENCES TO RELATED APPLICATIONS

The present invention contains subject matter related to Japanese Patent Application JP 2008-028089 filed in the Japan Patent Office on Feb. 7, 2008, the entire contents of which being incorporated herein by reference.

BACKGROUND OF THE INVENTION

1. Field of the Invention

The present invention relates to a thin film transistor substrate having a thin film transistor (TFT) and a capacitor formed in the substrate, a defect repairing method therefor, and a display device.

2. Description of the Related Art

Flat-panel type display devices that are now becoming the mainstream of display devices include liquid crystal display devices, plasma display devices, organic EL (Electro Luminescence) display devices and the like. Some of these devices use a thin film transistor substrate (hereinafter referred to also as a "TFT substrate") in which substrate a driving circuit including a TFT is formed. The TFT substrate is obtained by forming the film of a wiring layer and a semiconductor layer on a substrate mainly made of a glass plate by sputtering or CVD (Chemical Vapor Deposition), and patterning the film by photolithography to form a TFT circuit and a wiring pattern.

In a process of manufacturing the TFT substrate, foreign matter referred to as dust may result in a missing pattern or an excess residue. Such missing patterns (open defects) or excess residues (short defects) are collectively referred to as defects, and cause a circuit disconnection or a short circuit. As a result, various display abnormalities occur, such as a pixel dark dot (non-emitting dot defect), a pixel bright dot (dot defect of emitting light at all times or emitting noticeably brighter light than the periphery), a dark line (non-emitting line defect), a bright line (line defect of emitting light at all times or emitting noticeably brighter light than the periphery), an entire-surface display abnormality, or the like. Excluding a limited number of pixel dark dots, a display device having such a display abnormality is regarded as a defective, and cannot be shipped as a product.

Therefore, in a process of mass-producing the TFT substrate, a pattern defect is detected by using an optical inspection device, an electrical inspection device or the like, and a defect repair is made on the basis of a result of the detection to normalize the operation of the TFT substrate, or an abnormality alleviating measure such, for example, as making pixel bright dots or a bright line dark dots is taken.

One of repairing methods bridges disconnected parts to achieve conduction (connection type repair). As the bridging method of the connection type repair, a chemical vapor thin film forming (laser CVD) system using laser light, a conductive thin film transfer (laser transfer) system using laser light, and a system using a conductive micro-paste have been developed and put to practical use.

When an open defect is repaired by the connection type repair, patterns at both ends of the open defect may be directly connected to each other, or may be connected to each other via patterns connected to the patterns at both ends. In either case, the patterns to be connected need to be directly exposed on a surface, or need to be exposed under an insulating layer without being covered by another pattern.

SUMMARY OF THE INVENTION

However, the TFT circuit has a plurality of patterns laminated with an insulating layer in between. When an open defect occurs in a pattern in a lower layer, the pattern in the lower layer may be covered by a pattern in an upper layer and thus unable to be connected. Such a pattern in a lower layer is typified by an electrode on a back surface side of a pair of electrodes of a capacitor within a pixel, the electrode on the back surface side not appearing on a surface. In addition, a similar problem may occur at a contact part between overlapping pieces of wiring.

Incidentally, in related art, a few methods have been proposed which facilitate a repair to a TFT substrate by devising the shape of capacitor electrodes. For example, in Japanese Patent No. 3462792, a constricted part is formed at a drain electrode for obtaining an auxiliary capacitance, an aperture is formed in a pixel electrode situated above the constricted part, and the constricted part is cut by laser irradiation from a back surface. This method deals with various defects by providing a plurality of constricted parts and apertures, but no consideration is given to an open defect in a capacitor electrode.

Incidentally, a defect repairing method for a TFT substrate in which consideration is given to an open defect in a capacitor electrode has been proposed which method forms an auxiliary capacitance line or independent wiring in a same layer as the auxiliary capacitance line into a structure that overlaps a plurality of pieces of upper-layer wiring, and irradiates an overlap part with laser light to make a fused junction (see Japanese Patent No. 2962932 (hereinafter referred to as Patent Document 1), for example). However, this method produces two defective pixels after a repair, and thus cannot be said to be suitable for recent display devices, which are required of high display quality.

The present invention has been made in view of such problems. It is desirable to provide a thin film transistor substrate, a defect repairing method therefor, and a display device that make it possible to make a connection type repair to an electrode on a back surface side of a capacitor.

A thin film transistor substrate according to an embodiment of the present invention includes: (A) a substrate; (B) a thin film transistor and a capacitor formed on the substrate; and (C) a protective film for protecting an electrode on a back surface side of the capacitor when an electrode on a front surface side of the capacitor is cut by irradiation with laser light, the protective film being disposed at such a position as to enclose a corner part of the electrode on the front surface side between the electrode on the front surface side and the electrode on the back surface side of the capacitor.

According to an embodiment of the present invention, there is provided a defect repairing method for repairing an open defect occurring in a path leading to an electrode on a back surface side of a capacitor of a thin film transistor substrate, the thin film transistor substrate having a thin film transistor and the capacitor on a substrate. The method includes the steps of: disposing a protective film for protecting the electrode on the back surface side of the capacitor when an electrode on a front surface side of the capacitor is cut by irradiation with laser light at such a position as to enclose a corner part of the electrode on the front surface side between the electrode on the front surface side and the electrode on the back surface side of the capacitor; separating the corner part by cutting the electrode on the front surface side by irradiation with laser light at a position where the protective film is present; and forming wiring by a connection type repair with the electrode on the back surface side which electrode is present under the corner part as one terminal.

According to an embodiment of the present invention, there is provided a defect repairing method for repairing a same-layer short defect occurring between a source electrode of a thin film transistor and an electrode on a front surface side of a capacitor of a thin film transistor substrate, the thin film transistor substrate having the thin film transistor and the capacitor on a substrate. The method includes the steps of: disposing a protective film for protecting an electrode on a back surface side of the capacitor when the electrode on the front surface side of the capacitor is cut by irradiation with laser light at such a position as to enclose a corner part of the electrode on the front surface side between the electrode on the front surface side and the electrode on the back surface side of the capacitor; cutting the same-layer short defect by irradiation with laser light; separating the corner part by cutting the electrode on the front surface side by irradiation with laser light at a position where the protective film is present; and forming wiring by a connection type repair with the electrode on the back surface side which electrode is present under the corner part as one terminal.

A display device according to an embodiment of the present invention has a display element on a thin film transistor substrate, wherein the thin film transistor substrate is formed by the thin film transistor substrate according to the above-described embodiment of the present invention.

The thin film transistor substrate according to the above-described embodiment of the present invention has a protective film disposed at such a position as to enclose a corner part of an electrode on a front surface side of the capacitor between the electrode on the front surface side and an electrode on a back surface side of the capacitor, and the protective film protects the electrode on the back surface side when the electrode on the front surface side is cut by irradiation with laser light. Thus, when an open defect or an open circuit occurs in the electrode on the back surface side of the capacitor, the corner part of the electrode on the front surface side is separated by cutting the electrode on the front surface side at a position where the protective film is present, and thereafter wiring can be formed by a connection type repair with the electrode on the back surface side which electrode is present under the corner part as one terminal.

In the display device according to the above-described embodiment of the present invention, the thin film transistor substrate according to the above-described embodiment of the present invention is provided, and therefore an open defect or an open circuit in the electrode on the back surface side of the capacitor, to which a connection type repair is inapplicable in related art, is surely repaired. Hence, high display quality is achieved.

According to the thin film transistor substrate according to the above-described embodiment of the present invention or the defect repairing method for the thin film transistor substrate according to the above-described embodiment of the present invention, a protective film is disposed at such a position as to enclose a corner part of an electrode on a front surface side of the capacitor between the electrode on the front surface side and an electrode on a back surface side of the capacitor, and the protective film protects the electrode on the back surface side when the electrode on the front surface side is cut by irradiation with laser light. Thus, when an open defect or an open circuit occurs in the electrode on the back surface side of the capacitor, the corner part of the electrode on the front surface side is separated by cutting the electrode on the front surface side at a position where the protective film is present, and thereafter wiring can be formed by a connection type repair with the electrode on the back surface side which electrode is present under the corner part as one terminal. Thus, a connection type repair can be made to even an open defect or an open circuit in the electrode on the back surface side of the capacitor, the open defect or the open circuit being difficult to repair completely in related art, so that a rate of performance of repairs can be improved. The present invention is very suitable for repairing defects in an intra-pixel circuit causing pixel dark dots, pixel bright dots or the like in particular. Further, a manufacturing yield of the thin film transistor substrate can be improved as a result of an improvement in the rate of performance of repairs.

According to the display device according to the above-described embodiment of the present invention, the thin film transistor substrate according to the above-described embodiment of the present invention is provided, and therefore an open defect or an open circuit in the electrode on the back surface side of the capacitor, to which a connection type repair is inapplicable in related art, is surely repaired. Hence, high display quality can be achieved.

BRIEF DESCRIPTION OF THE DRAWINGS

FIG. 28A is a front view of a fifth example of application in an opened state, FIG. 28B is a side view of the fifth example of application in the opened state, FIG. 28C is a front view of the fifth example of application in a closed state, FIG. 28D is a left side view of the fifth example of application in the closed state, FIG. 28E is a right side view of the fifth example of application in the closed state, FIG. 28F is a top view of the fifth example of application in the closed state, and FIG. 28G is a bottom view of the fifth example of application in the closed state;

DETAILED DESCRIPTION OF THE PREFERRED EMBODIMENTS

Preferred embodiments of the present invention will hereinafter be described in detail with reference to the drawings.

First Embodiment

Figure 1:
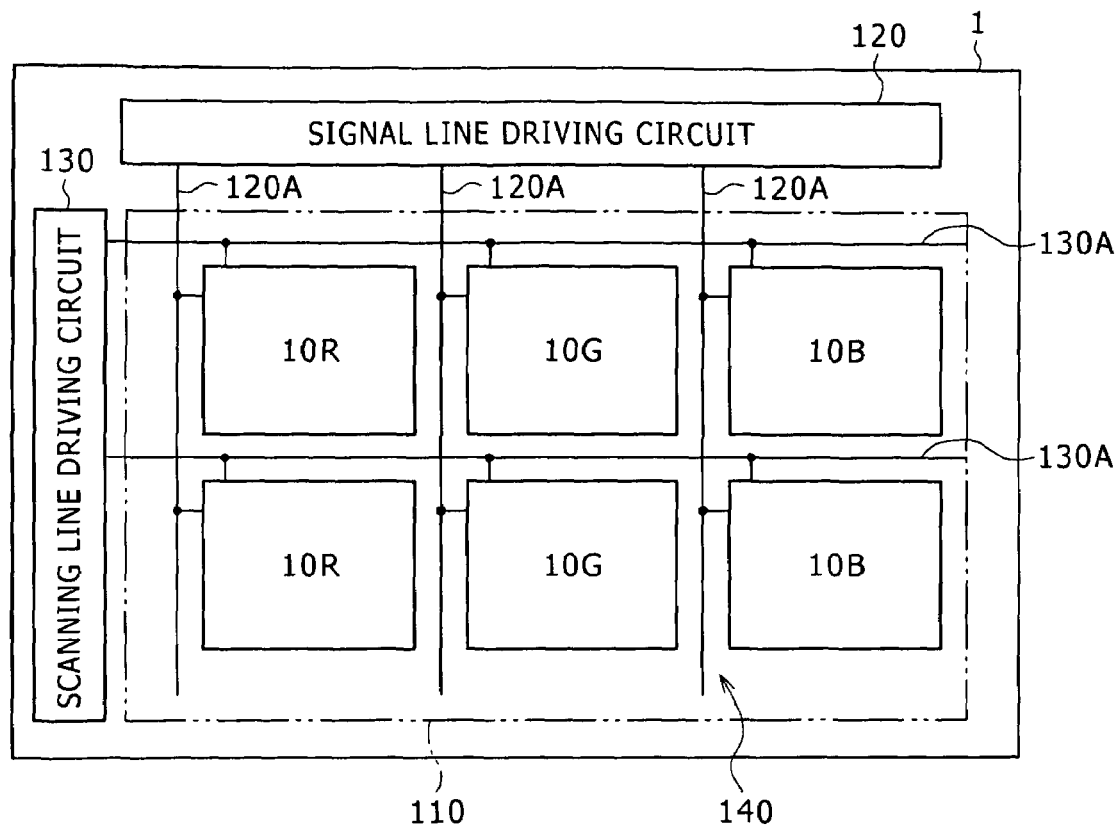
FIG. 1 is a diagram showing a configuration of a display device according to a first embodiment of the present invention.

FIG. 1 shows a configuration of a display device according to a first embodiment of the present invention. This display device is used as a very thin type organic light emitting color display device or the like. For example, the display device has, on a TFT substrate 1, a display region 110 formed by arranging, for example, a plurality of organic light emitting elements 10R, 10G, and 10B to be described later as display elements in the form of a matrix, and a signal line driving circuit 120 as a driver for video display and a scanning line driving circuit 130 formed on the periphery of the display region 110.

Figure 2:
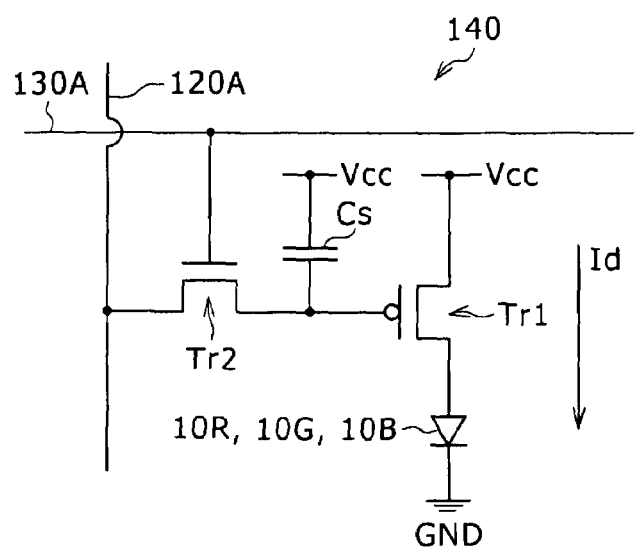
FIG. 2 is an equivalent circuit diagram showing an example of a pixel driving circuit shown in FIG. 1.

A pixel driving circuit 140 is formed within the display region 110. FIG. 2 shows an example of the pixel driving circuit 140. This pixel driving circuit 140 is formed in a layer under a first electrode 71 to be described later. The pixel driving circuit 140 is an active type driving circuit including a driving transistor Tr1 and a writing transistor Tr2, a capacitor (storage capacitor) Cs between the driving transistor Tr1 and the writing transistor Tr2, and an organic light emitting element 10R, 10G, or 10B connected in series with the driving transistor Tr1 between a first power supply line (Vcc) and a second power supply line (GND). The driving transistor Tr1 and the writing transistor Tr2 are formed by a TFT of an ordinary inverted staggered structure (so-called bottom gate type).

The pixel driving circuit 140 has a plurality of signal lines 120A in a column direction and a plurality of scanning lines 130A in a row direction. A point of intersection of each signal line 120A and each scanning line 130A corresponds to one of the organic light emitting elements 10R, 10G, and 10B (subpixels). Each signal line 120A is connected to the signal line driving circuit 120. An image signal is supplied from the signal line driving circuit 120 to the source electrode of the writing transistor Tr2 via the signal line 120A. Each scanning line 130A is connected to the scanning line driving circuit 130. A scanning signal is sequentially supplied from the scanning line driving circuit 130 to the gate electrode of the writing transistor Tr2 via the scanning line 130A.

Figure 3:
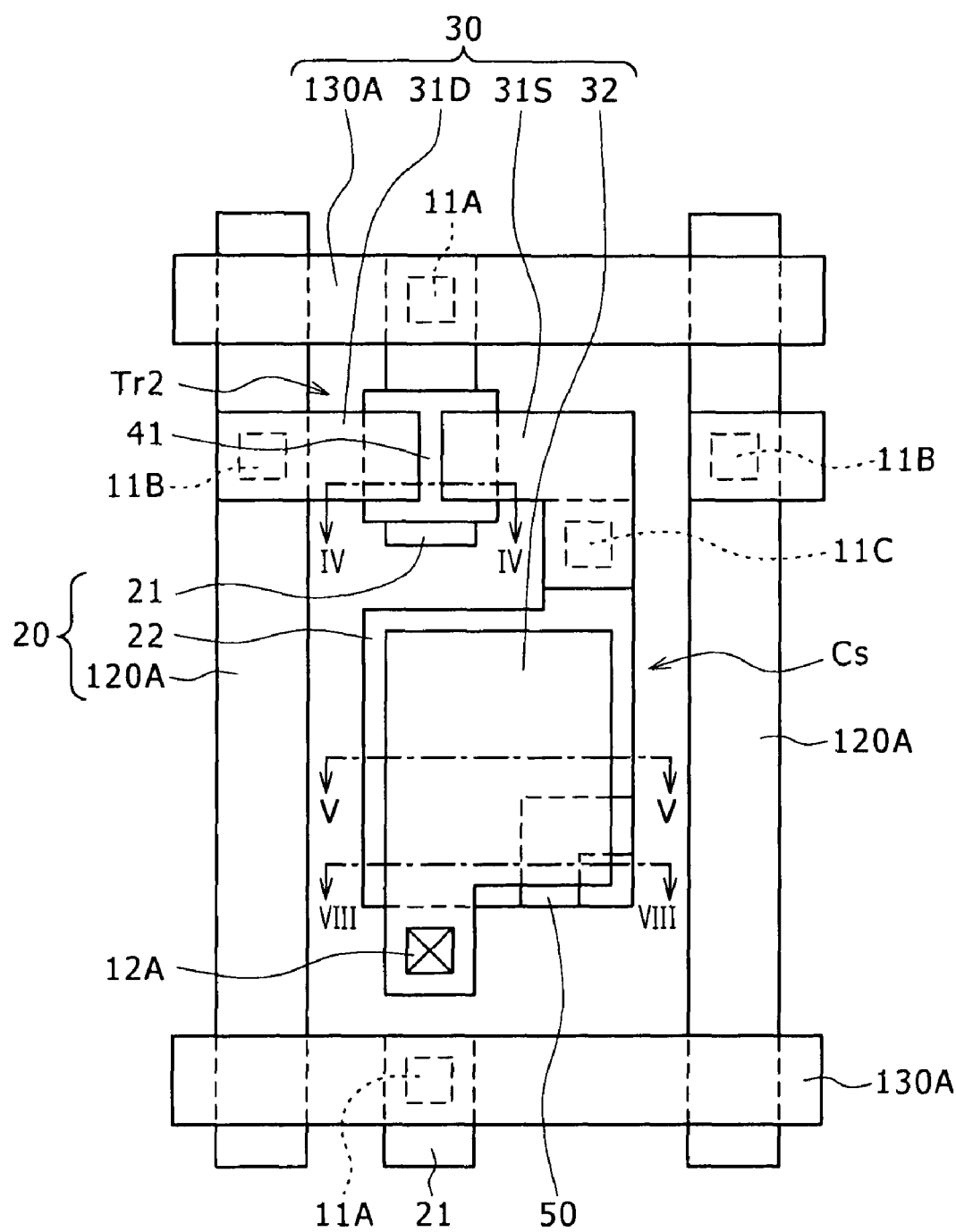
FIG. 3 is a plan view of a constitution of a part of the pixel driving circuit shown in FIG. 2.
Figure 4:
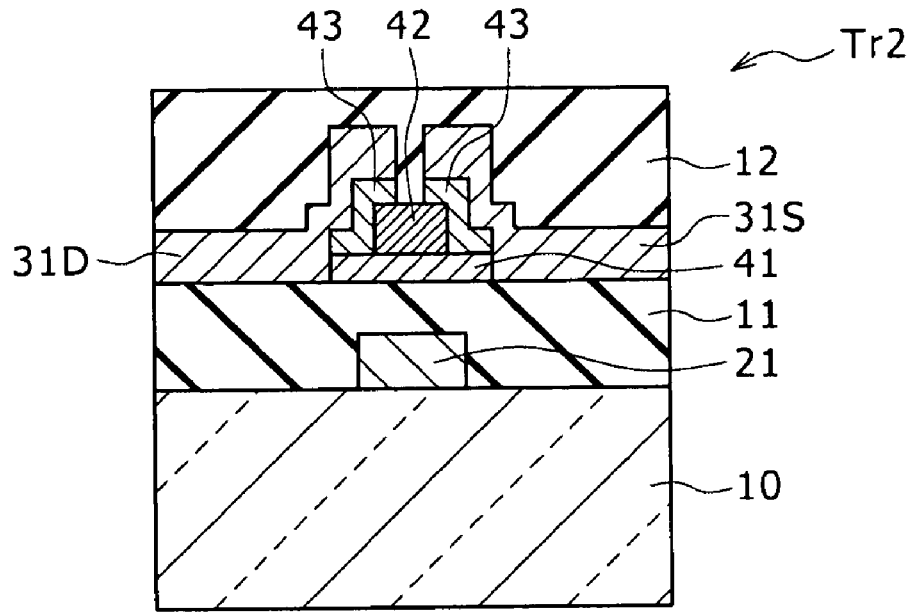
FIG. 4 is a sectional view taken along a line IV-IV in FIG. 3.
Figure 5:
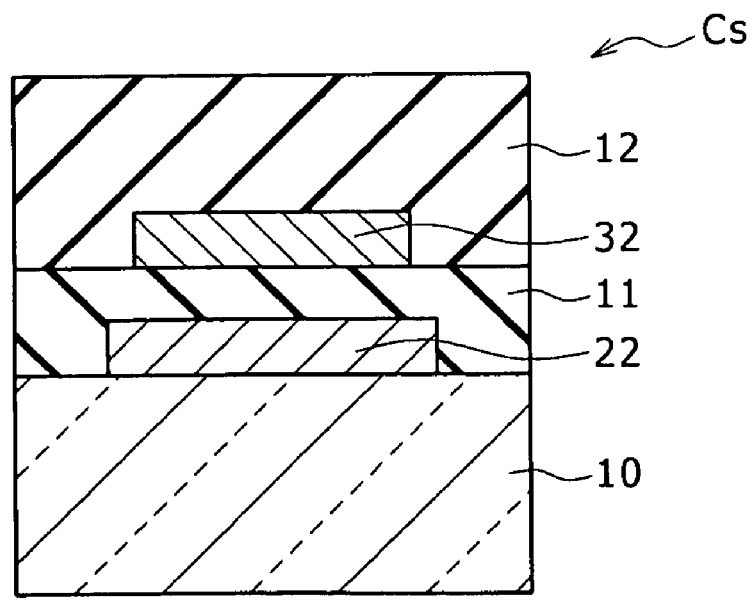
FIG. 5 is a sectional view taken along a line V-V in FIG. 3.

FIG. 3 shows a plan configuration of a part of the pixel driving circuit 140 (a part corresponding to the writing transistor Tr2 and the capacitor Cs in FIG. 2) on the TFT substrate 1. FIG. 4 and FIG. 5 respectively show sectional structures taken along a line IV-IV and a line V-V in FIG. 3. The TFT substrate 1 has a first wiring layer 20 and a second wiring layer 30 on a glass substrate 10 as a base material. A first insulating film 11 is formed between the first wiring layer 20 and the second wiring layer 30. A second insulating film 12 is formed on the second wiring layer 30.

The first wiring layer 20 has the signal line 120A, the gate electrode 21 of the writing transistor Tr2, and an electrode 22 on a back surface side of the capacitor Cs, the electrode 22 not appearing on a front surface. The first wiring layer 20 is formed by a metal or an alloy including at least one kind of a high melting point metal group including molybdenum (Mo), chromium (Cr), titanium (Ti), tungsten (W), and tantalum (Ta), for example.

The second wiring layer 30 has the scanning line 130A, the drain electrode 31D and the source electrode 31S of the writing transistor Tr2, and an electrode 32 on a front surface side of the capacitor Cs. The second wiring layer 30 has a laminated structure of an aluminum (Al) layer and a titanium (Ti) layer, for example.

An amorphous silicon film 41 serving as an active layer of the writing transistor Tr2 and an etch stopper layer 42 are formed on the first insulating film 11 and above the gate electrode 21. An n+ amorphous silicon film 43 for forming an ohmic contact is formed between the amorphous silicon film 41 and each of the drain electrode 31D and the source electrode 31S. The amorphous silicon film 41, for example, has a thickness of 10 nm to 50 nm. The amorphous silicon film 41 may be crystallized into polycrystalline silicon (p-Si) or microcrystalline silicon by an annealing process that irradiates the a-Si film with laser light. The etch stopper layer 42, for example, has a thickness of 50 nm to 500 nm, specifically about 200 nm, and is formed of SiNx, SiOx, or SiON. The n+ amorphous silicon film 43, for example, has a thickness of 10 nm to 300 nm, specifically about 100 nm.

The first insulating film 11 also has a function as the gate insulating film of the writing transistor Tr2 and the insulating film of the capacitor Cs, and is formed of SiNx, SiOx, or SiON. The first insulating film 11 desirably has a thickness of, for example, 50 nm to 700 nm, specifically about 300 nm in consideration of leakage current and a capacitance balance. The first insulating film 11 is provided with opening parts forming contact parts 11A, 11B, and 11C. The contact part 11A is to make an electric connection between the gate electrode 21 and the scanning line 130A. The contact part 11B is to make an electric connection between the signal line 120A and the drain electrode 31D. The contact part 11C is to make an electric connection between the source electrode 31S and the electrode 22 on the back surface side of the capacitor Cs.

The second insulating film 12, for example, has a thickness of about 300 nm, and is formed of SiNx, SiOx, or SiON. The second insulating film 12 is provided with an opening part forming a contact part 12A. The contact part 12A is to make an electric connection between the electrode 32 on the front surface side of the capacitor Cs and a wiring layer (not shown) formed on the second insulating film 12.

Summarizing the above, the writing transistor Tr2 is an etch stopper type thin film transistor formed by the gate electrode 21, the first insulating film 11 serving as a gate insulating film, the amorphous silicon film 41, the etch stopper layer 42, the n+ amorphous silicon film 43, the drain electrode 31D, and the source electrode 31S.

The capacitor Cs is formed by the electrode 22 on the back surface side, the first insulating film 11, and the electrode 32 on the front surface side. Incidentally, while the electrode 32 on the front surface side and the electrode 22 on the back surface side are designed so as to be of an identical size in an actual TFT substrate 1 for a purpose of maximizing the capacitance of the capacitor, FIG. 3 and FIG. 5 show the electrode 32 on the front surface side made smaller than the electrode 22 on the back surface side to facilitate understanding.

Figure 6:
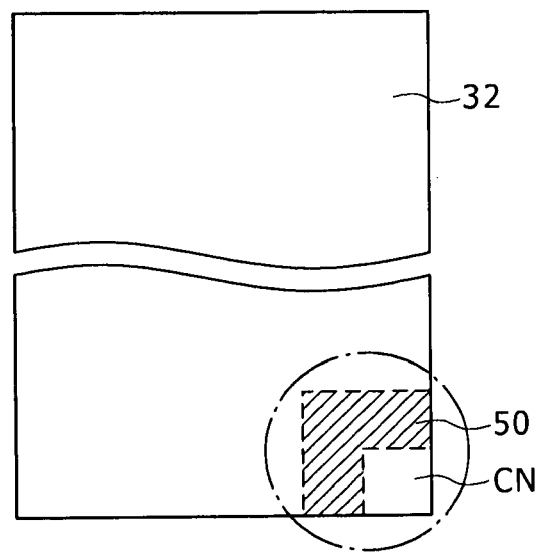
FIG. 6 is a plan view of a constitution of an electrode on a front surface side of a capacitor shown in FIG. 3.
Figure 7:
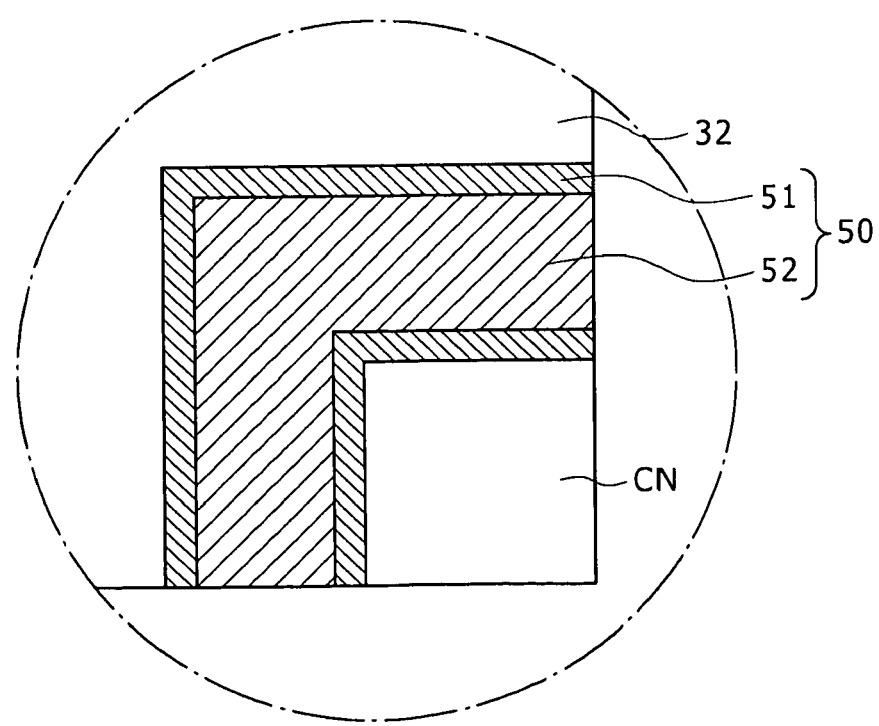
FIG. 7 is an enlarged plan view of a corner part in FIG. 6.
Figure 8:
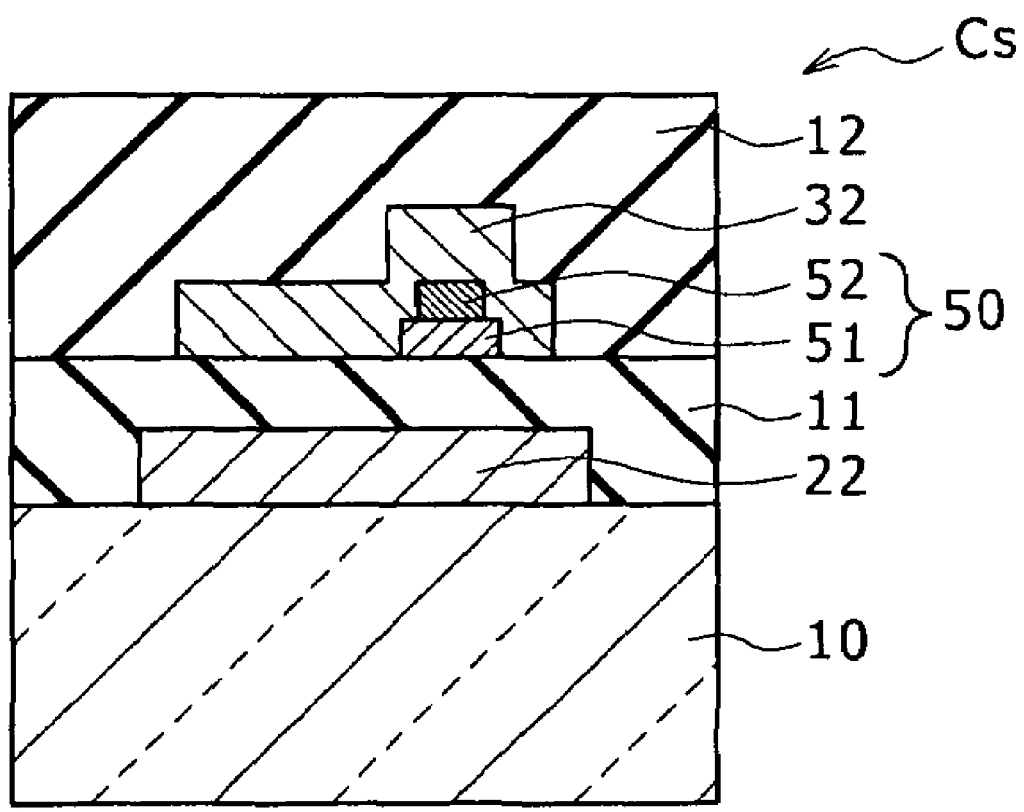
FIG. 8 is a sectional view including the corner part of the capacitor shown in FIG. 3.

FIG. 6 shows a plan structure of the electrode 22 on the back surface side of the capacitor Cs shown in FIG. 3. FIG. 7 shows a corner part of the capacitor Cs. FIG. 8 shows a sectional structure including the corner part of the capacitor Cs shown in FIG. 3. The capacitor Cs has a protective film 50 between the electrode 32 on the front surface side and the electrode 22 on the back surface side. The protective film 50 is to protect the electrode 22 on the back surface side when the electrode 32 on the front surface side is cut by irradiation with laser light. The protective film 50 is disposed in the shape of an L at such a position as to enclose the corner part CN of the electrode 32 on the front surface side. Thereby, a connection type repair can be made to the electrode 22 on the back surface side of the capacitor Cs in the TFT substrate 1 and the display device.

The protective film 50 is, for example, disposed on the first insulating film 11 between the electrode 32 on the front surface side and the electrode 22 on the back surface side, and covered by the electrode 32 on the front surface side. In addition, the protective film 50 desirably has a laminated structure of two layers or more including a layer capable of absorbing laser light. This is because the energy of excess laser light can be absorbed and thus machining stability can be enhanced when the electrode 32 on the front surface side is cut.

Specifically, the protective film 50 desirably has a laminated structure of a first layer 51 made of the same material as the amorphous silicon film 41 of the writing transistor Tr2 and capable of absorbing laser light and a second layer 52 made of the same material as the etch stopper layer 42 of the writing transistor Tr2. This is because the first layer 51 can enhance machining stability and the second layer 52 can be provided with a function as a spatial barrier so as to prevent the electrode 32 on the front surface side of the capacitor Cs and the first layer 51 made of silicon from forming a fused alloy at the cut position. This is also because the protective film 50 can be formed by a same manufacturing process as the amorphous silicon film 41 and the etch stopper layer 42 of the writing transistor Tr2. Incidentally, while the first layer 51 and the second layer 52 are actually designed so as to be of an identical size, FIG. 7 and FIG. 8 show the second layer 52 made smaller than the first layer 51 to facilitate understanding.

A method of repairing a defect of the TFT substrate 1 using the protective film 50 will next be described.

First Example

Open Defect Occurring in Electrode 22 on Back Surface Side of Capacitor Cs

Figure 9:
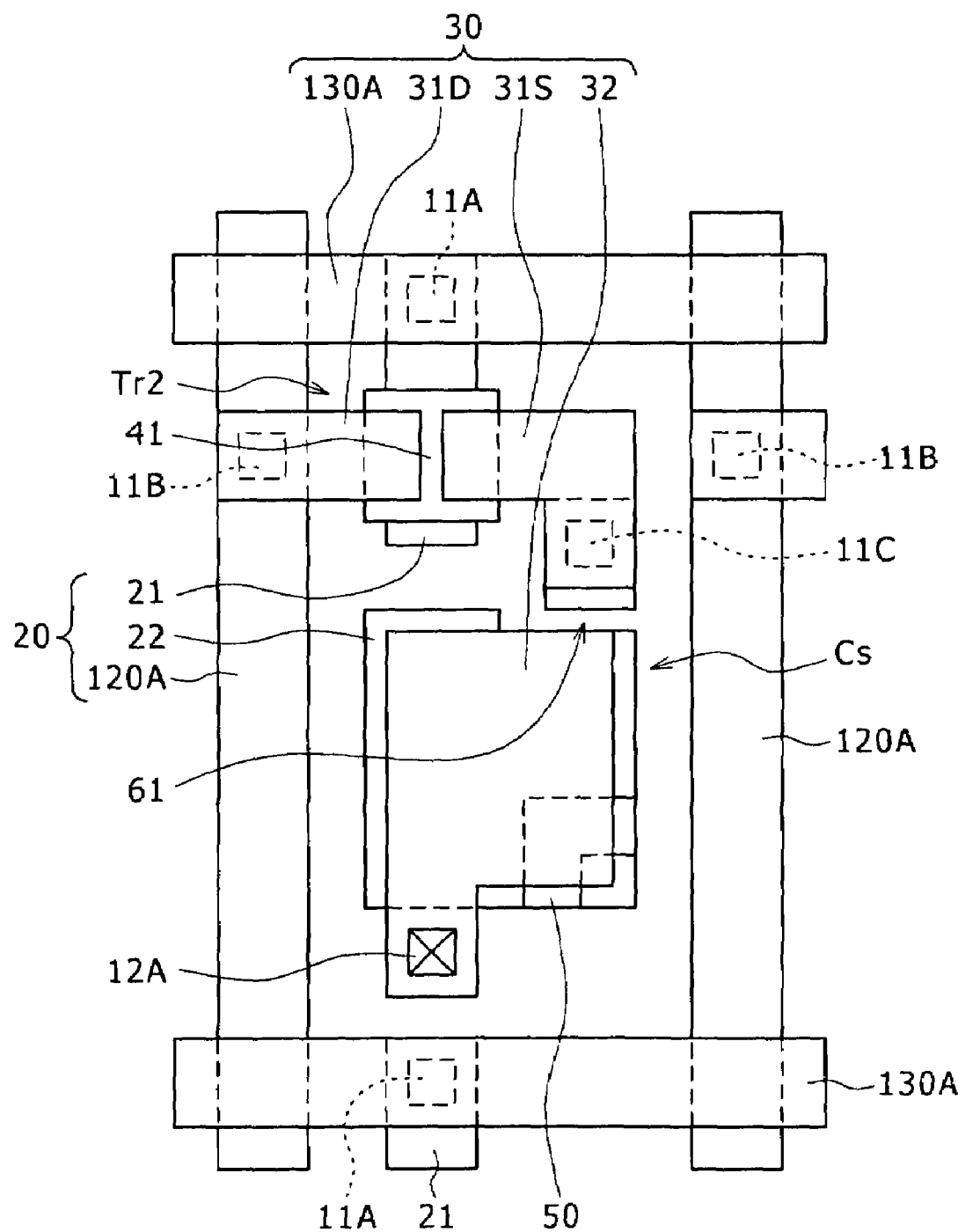
FIG. 9 is a plan view of assistance in explaining an open defect as a first example of a defect repairing method according to an embodiment of the present invention.
Figure 10:
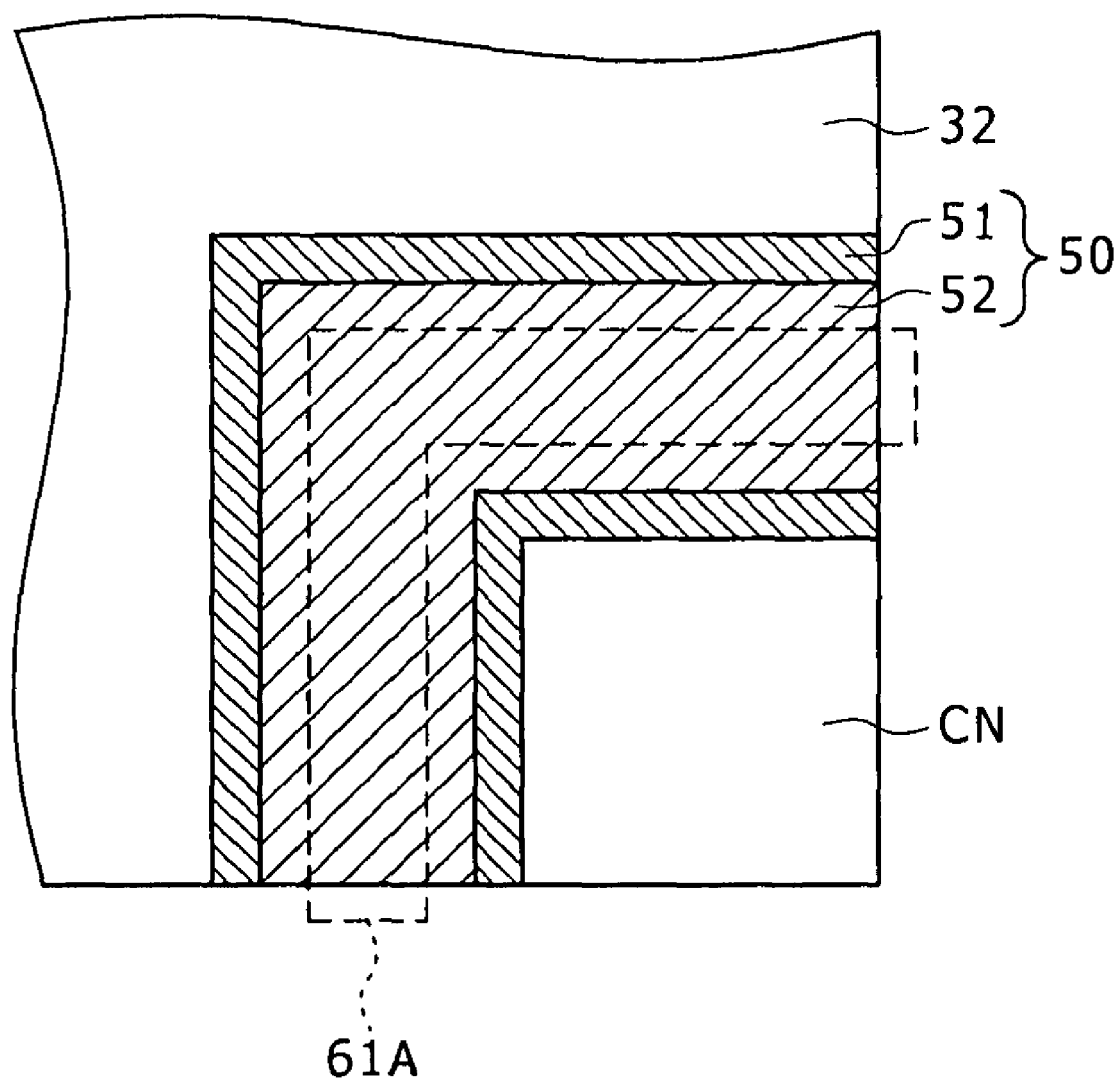
FIG. 10 is a plan view representing the first example in process order.

FIG. 9 shows a state in which an open defect 61 occurs in the electrode 22 on the back surface side of the capacitor Cs. First, as shown in FIG. 10, the electrode 32 on the front surface side of the capacitor Cs is cut at a position where the protective film 50 is present to separate the corner part CN of the electrode 32 on the front surface side by a cut part 61A. The cut is performed by a cut type repair, which cuts a pattern or a short defect by irradiation with laser light. At this time, because the protective film 50 is disposed between the electrode 32 on the front surface side and the electrode 22 on the back surface side, only the electrode 32 on the front surface side is cut at the cut part 61A, and there is very little fear of the electrode 22 on the back surface side being damaged.

Figure 11:
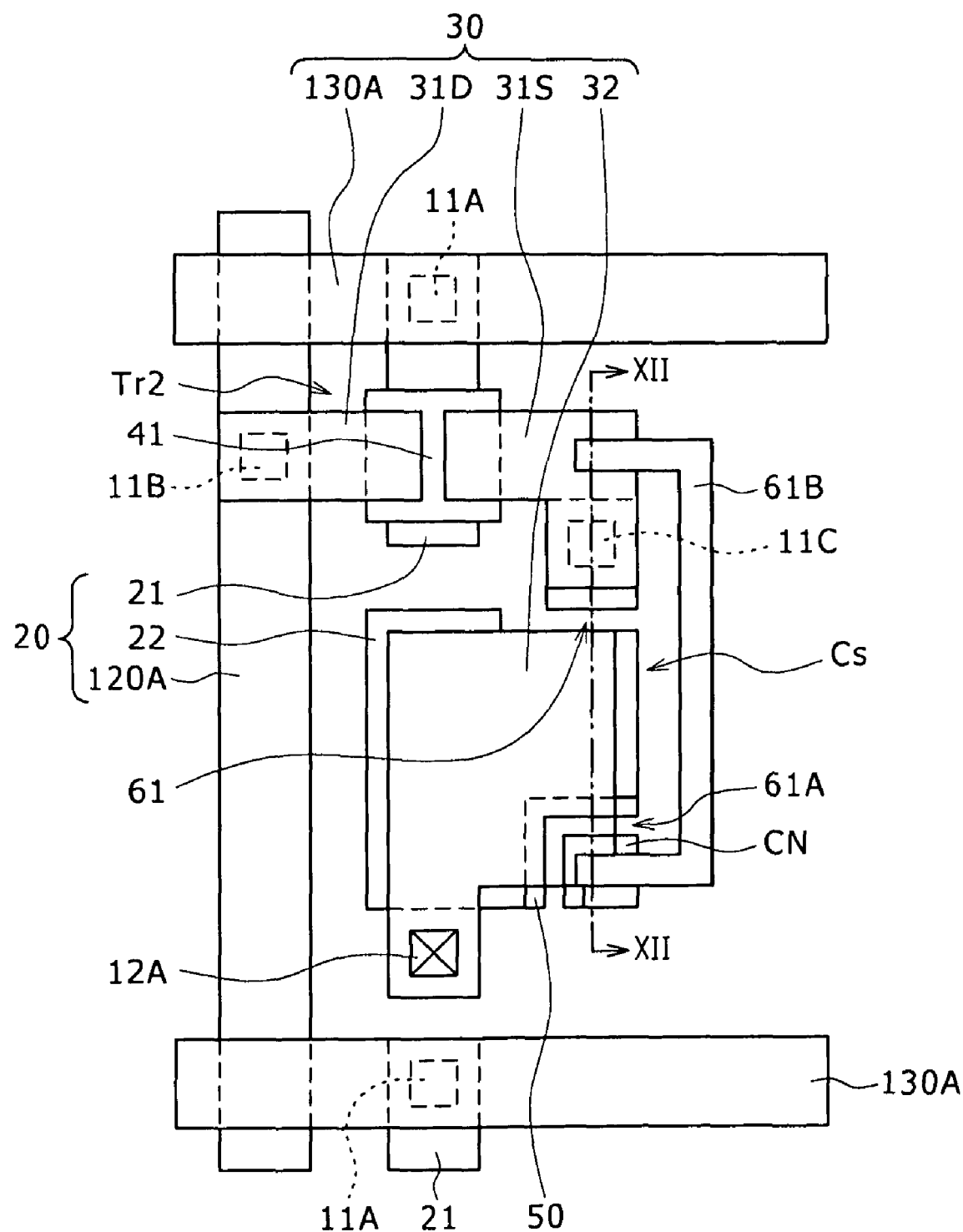
FIG. 11 is a plan view representing a process continued from FIG. 10.
Figure 12:
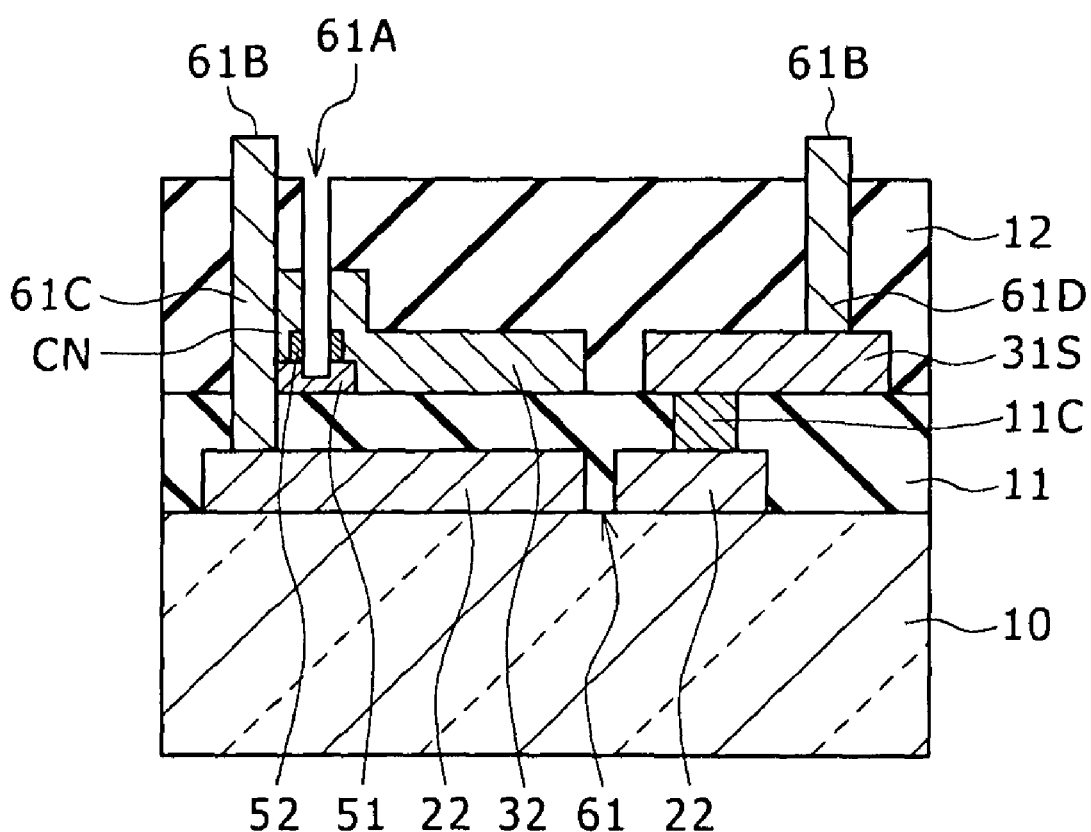
FIG. 12 is a sectional view taken along a line XII-XII in FIG. 11.

Next, as shown in FIG. 11 and FIG. 12, wiring 61B is formed by a connection type repair with the electrode 22 on the back surface side which electrode 22 is present under the separated corner part CN as one terminal and the source electrode 31S connected to a part of the electrode 22 on the back surface side which electrode 22 is divided by the open defect 61 as another terminal. Thereby, a failure caused by the open defect 61 is repaired completely, and no pixel defect remains. In addition, unlike the related defect repairing method described in the above-described Patent Document 1, there is no fear of occurrence of two defective pixels after the repair.

Incidentally, the wiring 61B and the electrode 22 on the back surface side can be connected to each other by forming in advance a contact hole 61C in the first insulating film 11 and the second insulating film 12. The source electrode 31S and the wiring 61B can be connected to each other by forming in advance a contact hole 61D in the second insulating film 12.

Laser irradiation used in the cut type repair is often diverted to the formation of these contact holes 61C and 61D. Conditions for optical output of laser irradiation in that case are set in advance such that the contact holes 61C and 61D are made and a pattern directly under the contact holes 61C and 61D is not damaged. By using the optical output whose conditions are set, the contact holes 61C and 61D can be provided without the pattern directly under the contact holes 61C and 61D being seriously damaged. This is true for a case of providing the contact holes 61C and 61D in only the second insulating film 12 and a case of providing the contact holes 61C and 61D in both the first insulating film 11 and the second insulating film 12.

The machining stability of the cut type repair is particularly important in the first example. The reasons are as follows. First, when the cut part 61A resulting from the cut type repair does not completely cut the electrode 32 on the front surface side, a new problem of a short circuit between the electrode 32 on the front surface side and the electrode 22 on the back surface side is caused by the wiring 61B formed by the connection type repair. In addition, when the cut part 61A reaches the electrode 22 on the back surface side and completely cuts and separates the electrode 22 on the back surface side, the wiring 61B is not connected to the electrode 22 on the back surface side, so that the open defect 61 is not repaired.

Machining stability is achieved by the presence of the first layer 51 of the protective film 50. The first layer 51 is formed by silicon, and absorbs laser light having wavelengths of 300 nm to 1100 nm used in the cut type repair. Thus, excess laser light passed through the electrode 32 on the front surface side of the capacitor Cs is absorbed by the first layer 51 formed by silicon. The first layer 51 is ablated by the absorbed energy. The amount of energy that makes the first layer 51 disappear through the ablation becomes a machining margin, so that machining stability can be enhanced. Incidentally, because the second layer 52 formed by the same material as the etch stopper layer 42 and the first insulating film 11 are formed by SiO or SiN, the second layer 52 and the first insulating film 11 do not absorb laser light of the above wavelengths used in the cut type repair, and do not provide a machining margin.

When the excess laser light passed through the electrode 32 on the front surface side has a small amount of energy, the first layer 51 does not disappear, but remains in the cut part 61A. However, when the first layer 51 is a-Si or p-Si doped with no impurity, the first layer 51 and the electrode 32 on the front surface side do not come into ohmic contact with each other, and thus the corner part CN separated by the cut part 61A and the electrode 32 on the front surface side are not short-circuited.

In addition, the second layer 52 of the protective film 50 can be a spatial barrier so as to prevent the electrode 32 on the front surface side of the capacitor Cs and the first layer 51 from forming a fused alloy at the cut part 61A.

(Comparison with Related Structure)

Figure 13:
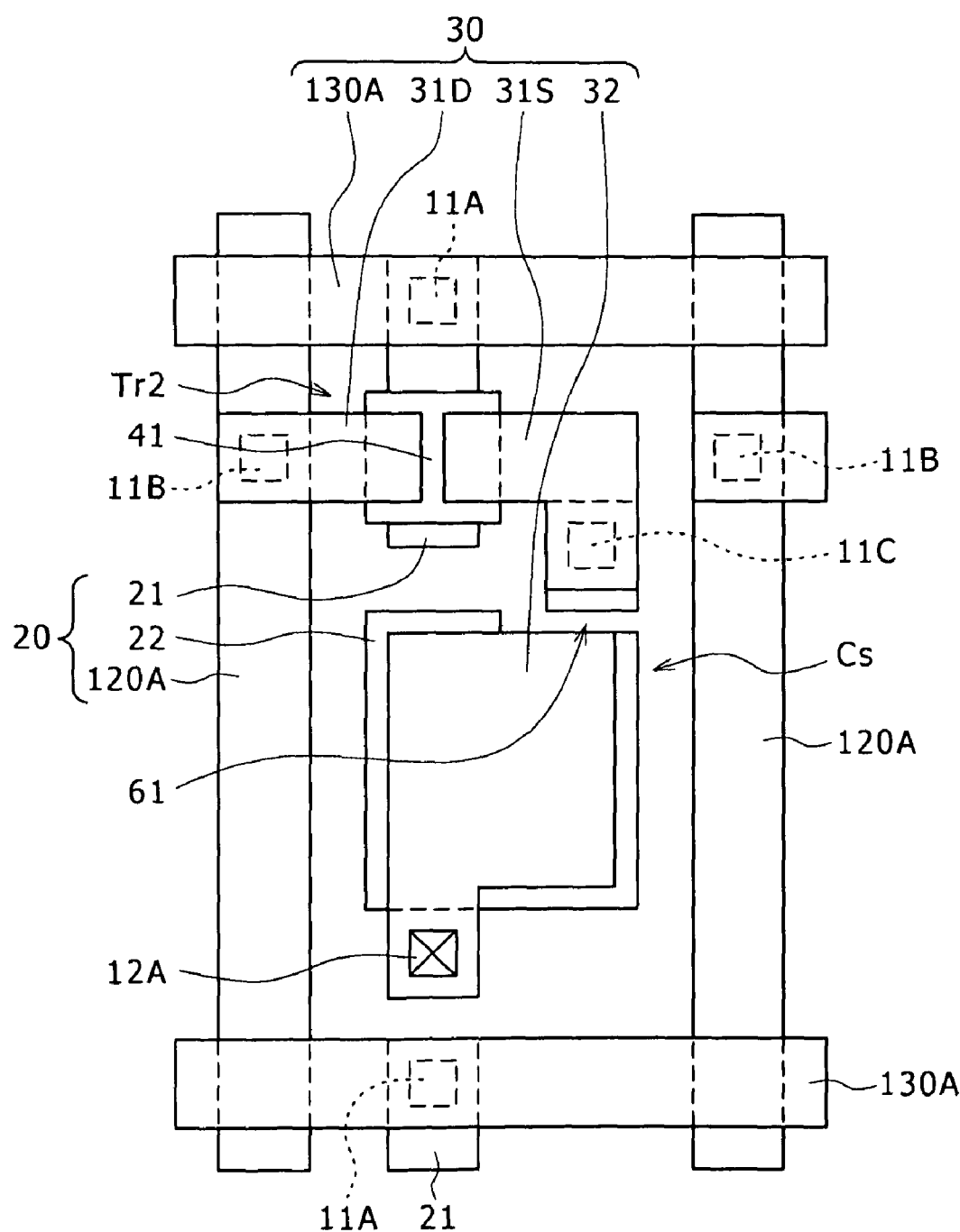
FIG. 13 is a plan view of assistance in explaining a related defect repairing method.

In related art, on the other hand, as shown in FIG. 13, the protective film 50 is not provided, and thus a connection type repair cannot be made when an open defect 61 occurs in the electrode 22 on the back surface side of the capacitor Cs.

Specifically, in order to make a connection type repair to the electrode 22 on the back surface side, a contact hole needs to be made in the first insulating film 11 by laser machining. Generally, when a wiring pattern in an upper layer which wiring pattern is not an object to be connected is present above a wiring pattern in a lower layer as an object to be connected, contact hole machining needs to be performed at a position distant from the wiring pattern in the upper layer by a few μm or more in order to prevent a new short-circuit failure. In addition, to secure reliability of the connection type repair, plan dimensions of the contact hole and the wiring pattern in the lower layer as the object to be connected need to be a few μm or more. The wiring pattern in the lower layer to which to make a connection type repair consequently needs to have a sufficiently large connection part not covered by the wiring pattern in the upper layer.

However, in the related structure shown in FIG. 13, a connection type repair cannot be made because a part covered by the electrode 32 on the front surface side in the electrode 22 on the back surface side which the electrode 22 is cut off by the open defect 61 does not include a sufficiently large connection part allowing contact hole machining for a connection type repair. This decreases a rate of performance of repairs, and is a factor in hindering improvement of a manufacturing yield of the TFT substrate 1.

Examples of Modification of First Example

It is to be noted that while a case of an open defect 61 occurring in the pattern itself of the electrode 22 on the back surface side of the capacitor Cs has been described in the first example, the first example is applicable to open defects 61 occurring in a path leading to the electrode 22 on the back surface side. Specifically, a case of an open defect occurring in the contact part 11C between the source electrode 31S and the electrode 22 on the back surface side of the capacitor Cs, for example, is cited.

An open defect occurring in the contact part 11C causes a same pixel display failure as a pixel display failure caused by the open defect 61 as shown in FIG. 13. As a method for connecting wiring patterns in different layers to each other, there is a method of irradiating an overlap part of the patterns at a position where the two patterns overlap each other in terms of a plan layout with a laser to make a fused junction. Hence, an open defect in the contact part 11C should be repaired by making a laser fused junction in a pattern overlap part near the contact part 11C.

In actuality, however, when an open defect occurs in the contact part 11C, there is generally a strong possibility that a normal layered structure is not formed in the contact part 11C and in the vicinity of the contact part 11C. Because laser irradiation conditions for making a laser fused junction are set in a normal layered structure, a success rate of the laser fused junction is expected to be lower than usual when the open defect occurs in the contact part 11C.

In addition, while the thickness of the insulating film needs to be reduced to increase the success rate of the laser fused junction, the thickness of the insulating film is determined on the basis of electrical specifications for the TFT substrate and the like. Thus, a TFT substrate using a thick insulating film may not allow a laser fused junction to be made.

On the other hand, the above-described first example makes a connection type repair not using a fused junction at a position distant from the contact part 11C. Thus, the first example is not easily affected by the layer conditions of the contact part 11C or the thickness of the insulating film, and significantly increases a repair success rate as compared with a method of making a fused junction at the contact part 11C as in a related case.

Second Example

Figure 14:
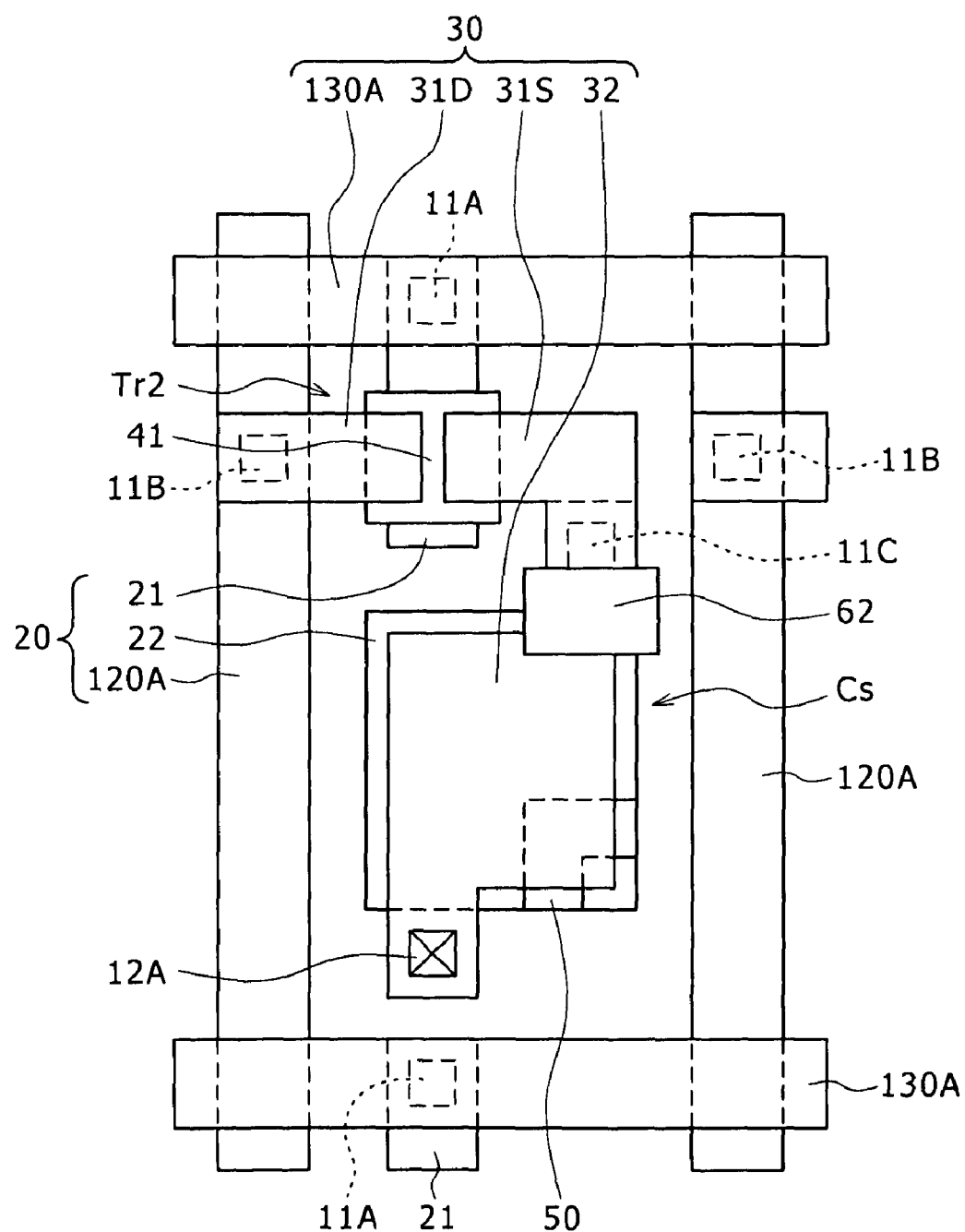
FIG. 14 is a plan view of assistance in explaining a same-layer short defect as a second example.
Figure 15:
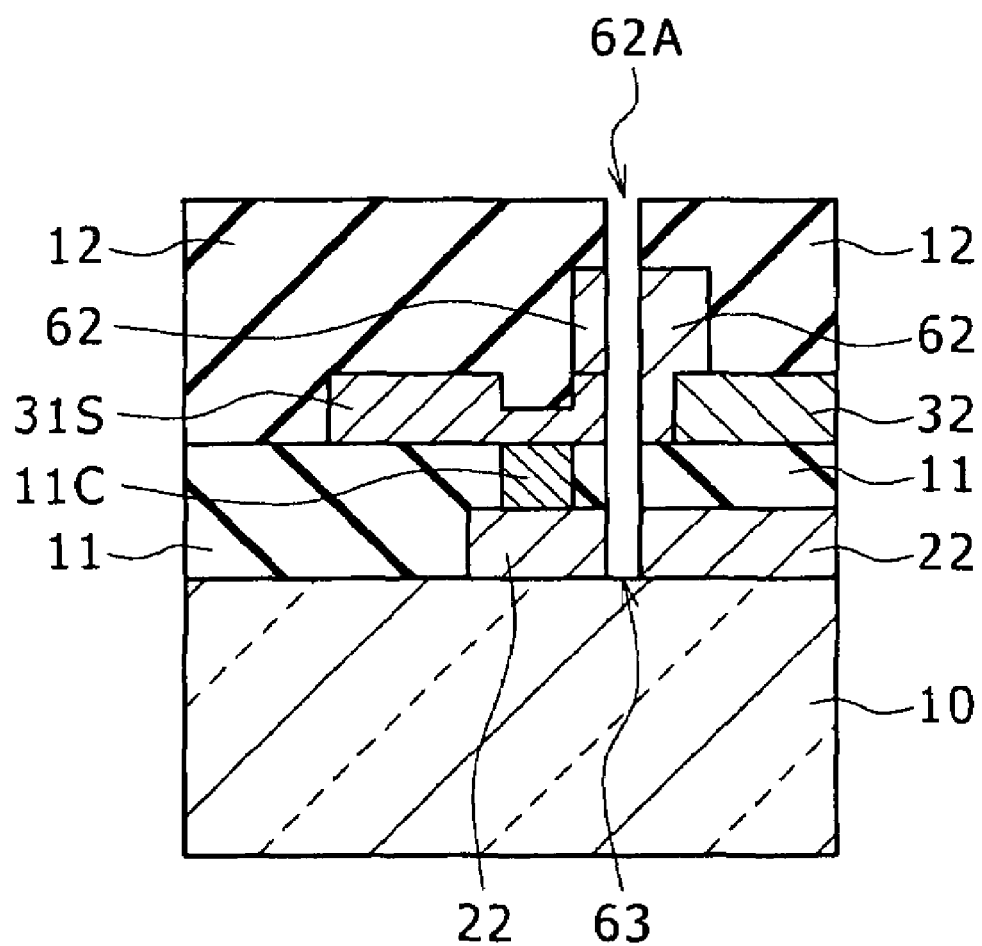
FIG. 15 is a plan view representing the second example in process order.

Same-Layer Short Defect Occurring Between Source Electrode 31S and Electrode 32 on Front Surface Side of Capacitor Cs FIG. 14 shows a state of a same-layer short defect 62 occurring between the source electrode 31S and the electrode 32 on the front surface side of the capacitor Cs. First, as shown in FIG. 15, a cut part 62A formed by a cut type repair cuts the same-layer short defect 62 to eliminate the short between the source electrode 31S and the electrode 32 on the front surface side of the capacitor Cs.

At this time, there is a strong possibility that the cut part 62A reaches the glass substrate 10, thus cutting the electrode 22 on the back surface side in the first wiring layer 20 and causing an open circuit 63. This is because when the same-layer short defect 62 itself is cut, material and thickness of the same-layer short defect 62 are not known, and thus irradiation is often performed with a higher optical output than in a case of a normal pattern cut in order to increase the probability of success in the cutting. Such a cut type repair can cut not only the same-layer short defect 62 but also a normal pattern (the electrode 22 on the back surface side in this case) present below the same-layer short defect 62.

Figure 16:
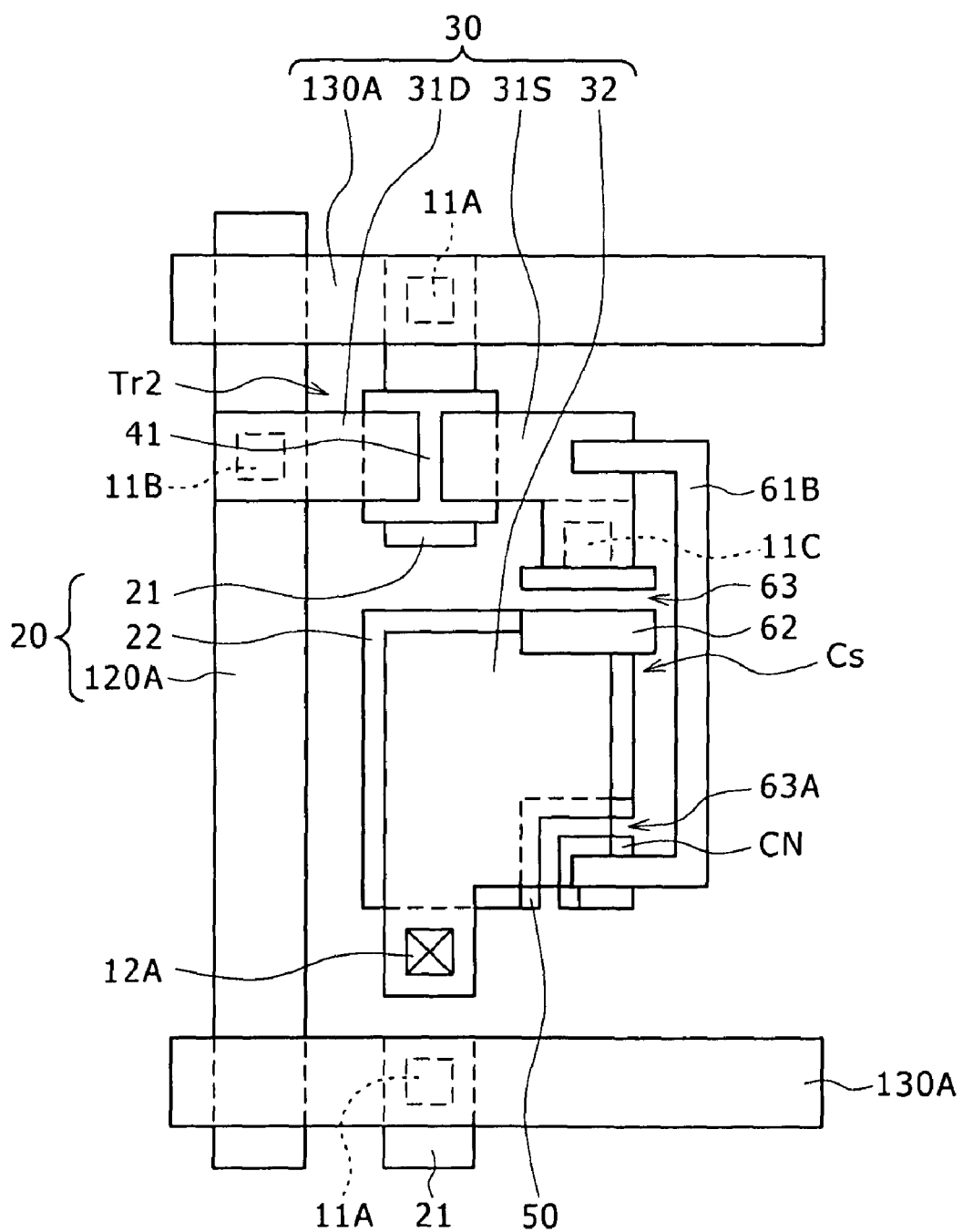
FIG. 16 is a plan view representing a process continued from FIG. 15.

It is accordingly necessary to repair the open circuit 63 that occurs in the electrode 22 on the back surface side of the capacitor Cs in a process of repairing such a same-layer short defect 62. The open circuit 63 can be repaired in a similar manner to that of the above-described first example. Specifically, first, as shown in FIG. 16, the electrode 32 on the front surface side of the capacitor Cs is cut by a cut type repair at a position where the protective film 50 is present to separate the corner part CN of the electrode 32 on the front surface side by a cut part 62A. At this time, as in the first example, because the protective film 50 is disposed between the electrode 32 on the front surface side and the electrode 22 on the back surface side, only the electrode 32 on the front surface side is cut at the cut part 63A, and there is very little fear of the electrode 22 on the back surface side being damaged.

Next, as shown in the same FIG. 16, wiring 63B is formed by a connection type repair with the electrode 22 on the back surface side which electrode 22 is present under the separated corner part CN as one terminal and the source electrode 31S connected to a part of the electrode 22 on the back surface side which electrode 22 is divided by the open circuit 63 as another terminal. The open circuit 63 is electrically connected by the wiring 63B. Thereby, failures caused by the same-layer short defect 62 and the open circuit 63 are repaired completely, and no pixel defect remains. In addition, unlike the related defect repairing method described in the above-described Patent Document 1, there is no fear of occurrence of two defective pixels after the repair.

(Comparison with Related Structure)

Figure 17:
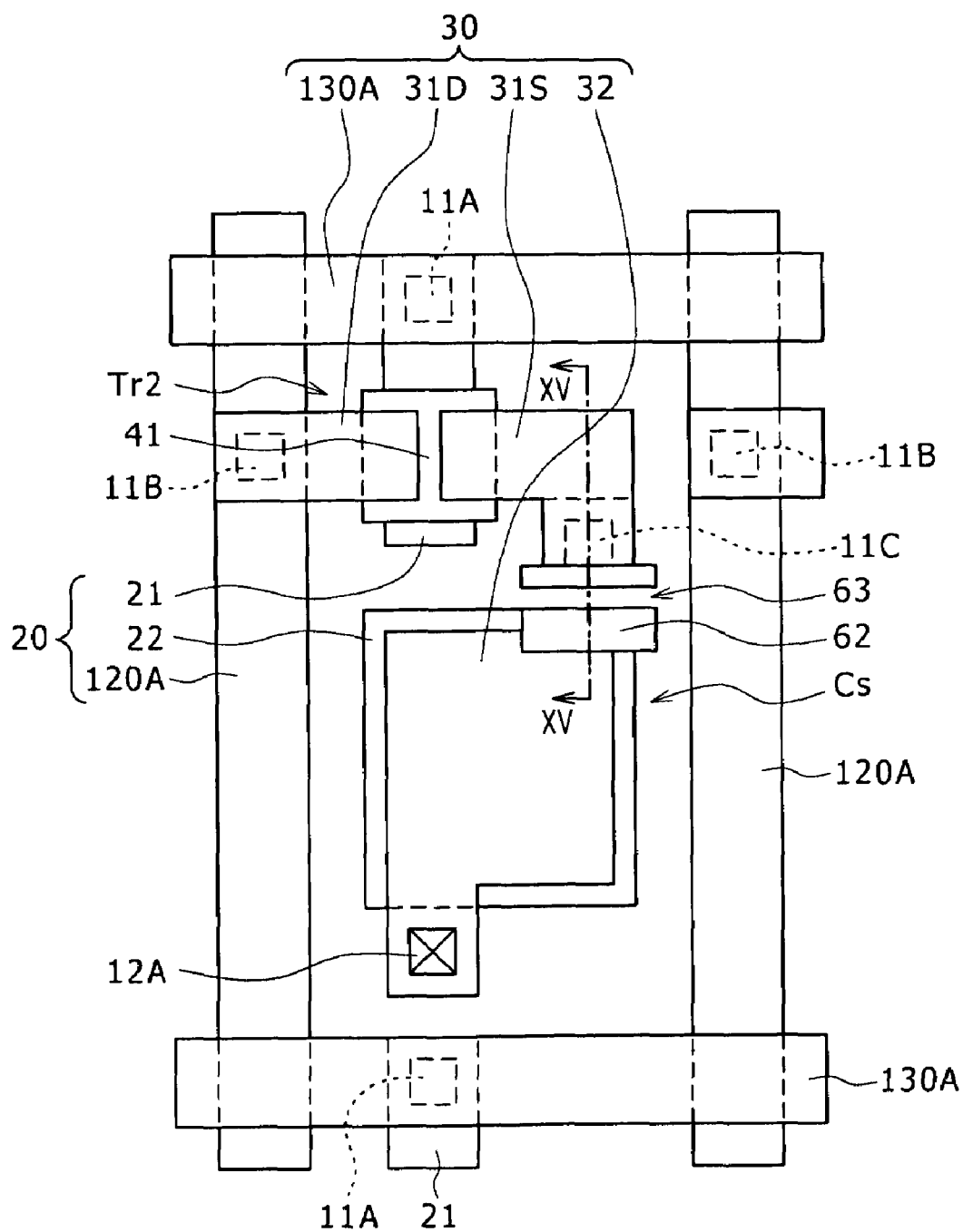
FIG. 17 is a plan view of assistance in explaining a related defect repairing method.

On the other hand, in related art, as shown in FIG. 17, the protective film 50 is not provided. Therefore, when the open circuit 63 occurs in the electrode 22 on the back surface side of the capacitor Cs in a process of repairing the same-layer short defect 62, as described in the first example, a connection type repair cannot be made because a part covered by the electrode 32 on the front surface side in the electrode 22 on the back surface side which electrode 22 is cut off by the open circuit 63 does not include a sufficiently large connection part allowing contact hole machining for a connection type repair.

(Supplement: Method of Repairing Interlayer Short Defect)

Figure 18:
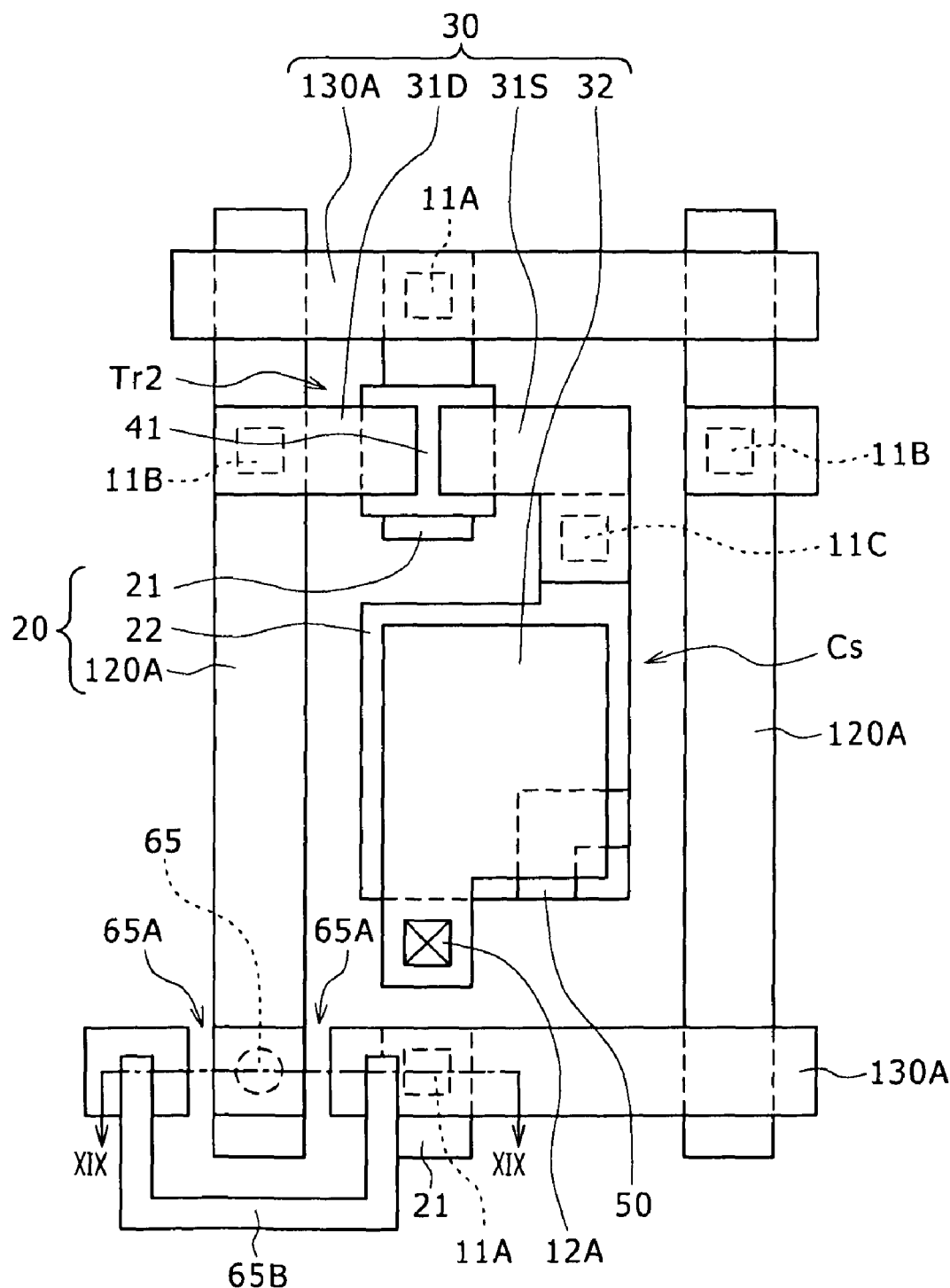
FIG. 18 is a plan view of assistance in explaining a method of repairing an interlayer short defect as a supplement.
Figure 19:
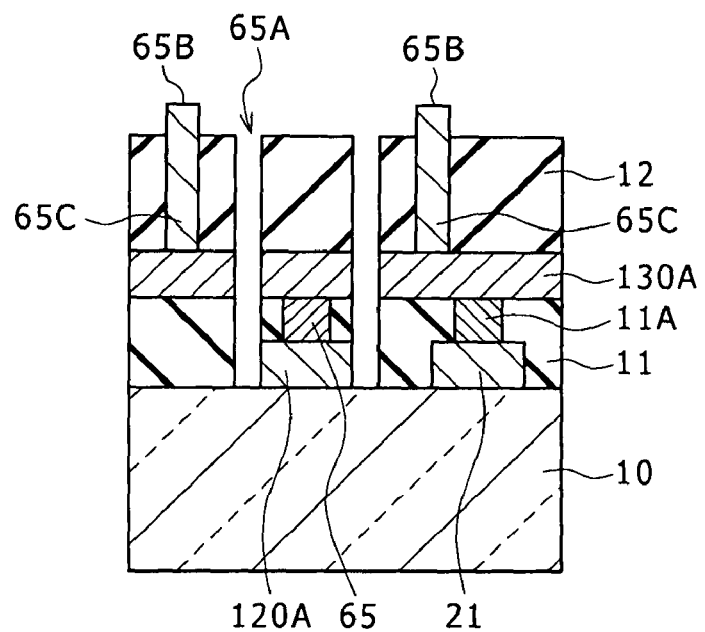
FIG. 19 is a sectional view taken along a line XIX-XIX in FIG. 18.

Incidentally, FIG. 18 and FIG. 19 illustrate a method of repairing an interlayer short defect 65 that short-circuits a signal line 120A and a scanning line 130A by penetrating the first insulating film 11, though the method does not particularly need the protective film 50. First, cut parts 65A are formed on both sides of the signal line 120A by a cut type repair to disconnect the interlayer short defect 65 and thus eliminate the short between the signal line 120A and the scanning line 130A.

Next, wiring 65B is formed by a connection type repair, so that the divided left and right patterns of the scanning line 130A are electrically connected to each other by the wiring 65B. Thereby, a failure caused by the interlayer short defect 65 is repaired completely.

Incidentally, the wiring 65B and the scanning line 130A can be connected to each other through a contact hole 65C formed in the second insulating film 12. The optical output of laser irradiation for forming the contact hole 65C is the same as that of the contact holes 61C and 61D in the first example.

(Effect of Protective Film 50 on Capacitance of Capacitor Cs)

In the present embodiment, there may be an effect of a decrease in capacitance of the capacitor Cs due to an increased interelectrode distance of the capacitor Cs in the part where the protective film 50 is present. This will be described in the following.

Suppose that specifications for the TFT substrate 1 in the present embodiment are as follows.
Screen Size: 32 inches wide
Number of Pixels: 1920×1080
(full high definition specifications)
Area of Capacitor within Pixel: 4392 $\mu m^2$ . . . (1)
(assumed to be one tenth (1/10) of a pixel area)
Thickness of First Insulating Film 11: 300 μm . . . (2)
Thickness of First Layer 51 (Amorphous Silicon Film 41) of Protective Film 50: 10 nm
Thickness of Second Layer 52 (Etch Stopper Layer 42) of Protective Film 50: 300 nm . . . (3)
Taper Angle of Second Layer 52: 30° . . . (4)

Suppose that specifications for a repair made in the present embodiment are as follows.
Width of Cut Type Repair: 5 μm . . . (5)
Finish Accuracy of Cut Type Repair: 1 μm . . . (6)
Size of Contact Hole Formed by Cut Type Repair: 5 μm . . . (7)
Finish Accuracy of Contact Hole Formed by Cut Type Repair: 1 μm . . . (8)
Machining Positioning Accuracy of Cut Type Repair: 1 μm . . . (9)
(The line width, finish accuracy, and machining positioning accuracy of the connection type repair do not affect the capacitance.)

Because the thickness of the first layer 51 is sufficiently smaller than the thickness of the first insulating film 11, and contributes little to the decrease in capacitance, the presence of the first layer 51 is ignored in this case. A minimum area necessary for machining a contact hole to the electrode 22 on the back surface side is 7 μm×7 μm from (7)+(8)+(9). A minimum width dimension excluding the taper part of the second layer 52 is 7 μm from (5)+(6)+(9). A width dimension of the taper part of the second layer 52 is 520 nm≈0.5 μm from (3)×tan(90−30).

Figure 20:
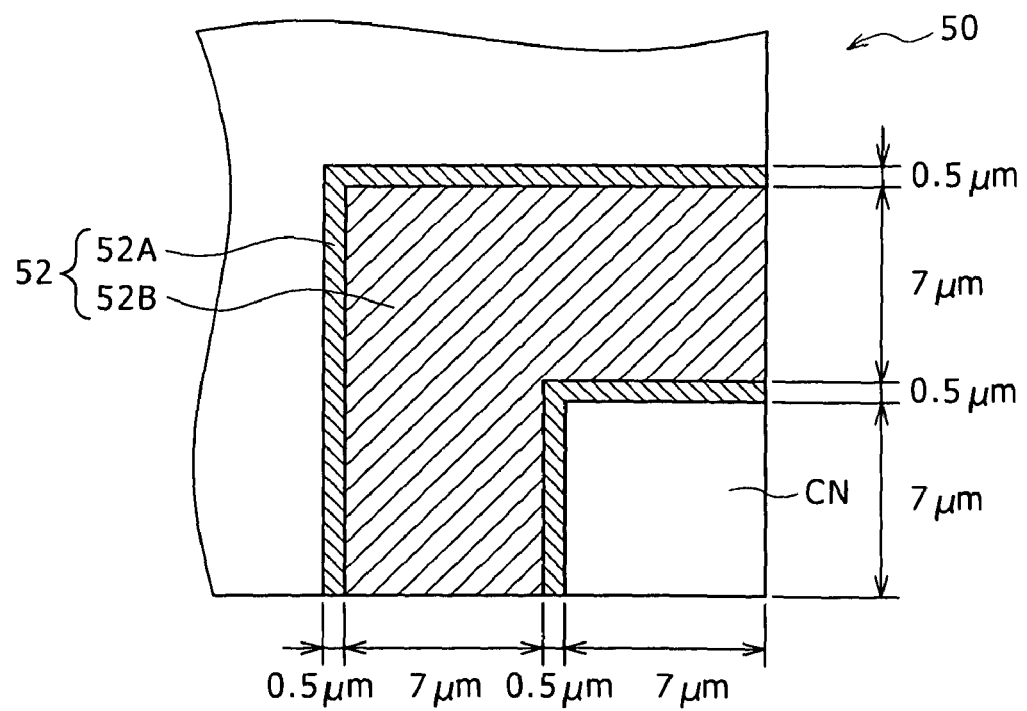
FIG. 20 is a plan view of assistance in explaining effect of a protective film on capacitance of the capacitor.

FIG. 20 shows the shape and dimensions of the protective film 50 that are determined by the above dimensions. From (2) and (3), the interelectrode distance of the capacitor Cs is doubled at a position where a part 52B excluding a taper part 52A of the second layer 52 is present, and thus capacitance per unit area at the position is half (1/2) of capacitance per unit area at a position where the second layer 52 is not present. In addition, average capacitance per unit area at the position where the taper part 52A of the second layer 52 is present is two thirds (1/1.5) of average capacitance per unit area at the position where the second layer 52 is not present. Allowing for all of these effects, a decrease in capacitance when the second layer 52 is present is 1.92%. At a time of designing the TFT substrate 1, capacitor electrode area needs to be increased by an amount corresponding to the capacitance decrease. However, as compared with generally increasing the capacitor electrode area by about 10% allowing for variations in capacitance due to variations in thickness of an insulating film between the electrodes of the capacitor, the capacitance decrease of 1.92% does not greatly affect the design.

In addition, a process of increasing the electrode area to compensate for the above-described capacitance decrease may increase a probability of occurrence of a same-layer short defect. An effect of this will be described in the following.

An amount of increase in capacitor electrode area necessary to compensate for the capacitance decrease of 1.92% is 84.3 $\mu m^2$. Supposing that the electrodes of the capacitor have a square shape, the amount of increase in the area lengthens the circumferential length of the electrodes of the capacitor by 2.54 μm from 265.09 μm. In general, when pattern conditions on the periphery are the same, the probability of occurrence of a same-layer short defect is proportional to the circumferential length of a pattern. In the present embodiment, the increase of 2.54 μm in the circumferential length of the electrodes of the capacitor raises the probability of occurrence of a same-layer short defect by 0.96%. However, a same-layer short defect formed with a peripheral pattern is repairable. Thus, in light of an advantage of remedying an unrepairable defect by the present embodiment, the increase in the probability of occurrence of a same-layer short defect to the above-described degree is not a factor that negates effects of the present embodiment.

Figure 21:
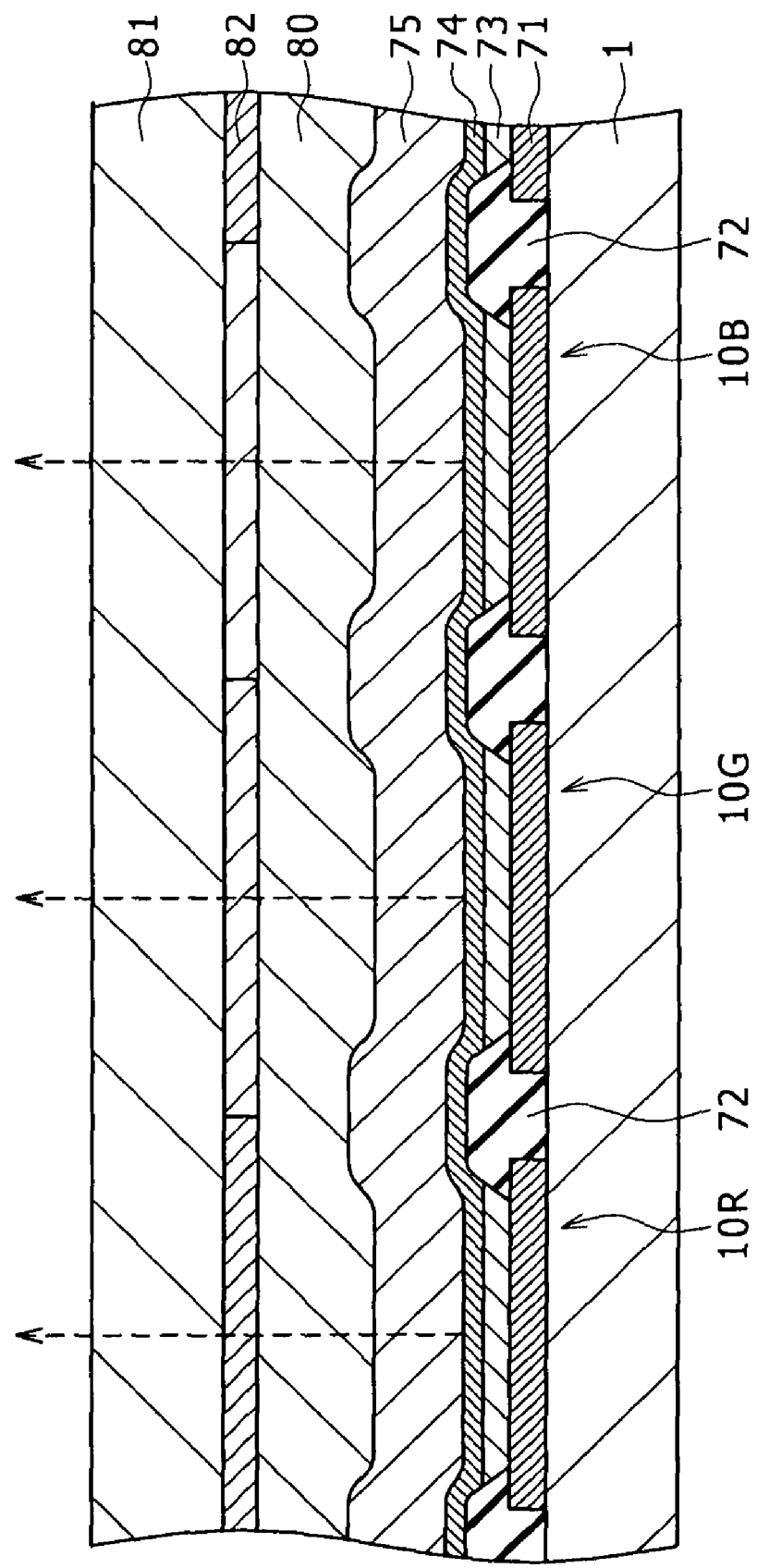
FIG. 21 is a sectional view of assistance in explaining a constitution of a display region shown in FIG. 1.

FIG. 21 shows a sectional constitution of the display region 110. In the display region 110, an organic light emitting element 10R emitting red light, an organic light emitting element 10G emitting green light, and an organic light emitting element 10B emitting blue light are formed in order in the form of a matrix as a whole. Incidentally, the organic light emitting elements 10R, 10G, and 10B have a plane shape in the form of a strip, and a set of adjacent organic light emitting elements 10R, 10G, and 10B forms one pixel.

The organic light emitting elements 10R, 10G, and 10B each have a structure formed by laminating a first electrode 71 as an anode, an interelectrode insulating film 72, an organic layer 73 including a light emitting layer to be described later, and a second electrode 74 as a cathode in this order on the TFT substrate 1.

Such organic light emitting elements 10R, 10G, and 10B are covered with a protective layer 75 of silicon nitride (SiN), silicon oxide (SiO) or the like as required, and is sealed by laminating a sealing substrate 81 made of glass or the like over an entire surface of the protective layer 75 with an adhesive layer 80 of thermosetting resin, ultraviolet curing resin or the like interposed between the sealing substrate 81 and the protective layer 75. The sealing substrate 81 may be provided with a color filter 82 and a light shielding film (not shown) as a black matrix as required.

The first electrode 71 is formed in such a manner as to correspond to each of the organic light emitting elements 10R, 10G, and 10B. In addition, the first electrode 71 has a function of a reflecting electrode that reflects light occurring in the light emitting layer, and desirably has as high reflectance as possible from a viewpoint of increasing luminous efficiency. For example, the first electrode 71 has a thickness of 100 nm to 1000 nm, and is formed by a simple substance or an alloy of a metallic element such as silver (Ag), aluminum (Al), chromium (Cr), titanium (Ti), iron (Fe), cobalt (Co), nickel (Ni), molybdenum (Mo), copper (Cu), tantalum (Ta), tungsten (W), platinum (Pt), gold (Au) or the like.

The interelectrode insulating film 72 is to secure insulation between the first electrode 71 and the second electrode 74 and accurately form a light emitting region into a desired shape. The interelectrode insulating film 72 is, for example, formed by an organic material such as a polyimide or the like or an inorganic insulating material such as silicon oxide ($SiO_2$) or the like. The interelectrode insulating film 72 has an opening corresponding to the light emitting region of the first electrode 71. Incidentally, while the organic layer 73 and the second electrode 74 may be disposed continuously on not only the light emitting region but also the interelectrode insulating film 72, light emission occurs in only the opening of the interelectrode insulating film 72.

The organic layer 73, for example, has a structure formed by laminating a hole injection layer, a hole transporting layer, a light emitting layer, and an electron transporting layer (none are shown) in this order from the side of the first electrode 71. Of these layers, however, the layers other than the light emitting layer may be provided as required. In addition, the organic layer 73 may have different compositions according to light emission colors of the organic light emitting elements 10R, 10G, and 10B. The hole injection layer is to enhance hole injection efficiency, and is a buffer layer for preventing leakage. The hole transporting layer is to enhance efficiency of hole transportation to the light emitting layer. The light emitting layer emits light as a result of recombination of electrons and holes through application of an electric field. The electron transporting layer is to enhance efficiency of electron transportation to the light emitting layer. Incidentally, a constituent material for the organic layer 73 may be an ordinary low-molecular-weight or polymer organic material, and is not particularly limited.

For example, the second electrode 74 has a thickness of 5 nm to 50 nm, and is formed by a simple substance or an alloy of a metallic element such as aluminum (Al), magnesium (Mg), calcium (Ca), sodium (Na) or the like. In particular, an alloy of magnesium and silver (MgAg alloy) or an alloy of aluminum (Al) and lithium (Li) (AlLi alloy) is desirable. In addition, the second electrode 74 may be formed by ITO (indium-tin complex oxide) or IZO (indium-zinc complex oxide).

The display device can be manufactured as follows, for example.

(Step of Forming TFT Substrate 1)

First, the first wiring layer 20 is formed on the glass substrate 10 by film formation of a metallic layer made of the above-described material by, for example, a sputtering method, and shaping the metallic layer into a predetermined form by, for example, photolithography and etching.

Next, the first insulating film 11 of the thickness and material described above is formed by, for example, plasma CVD (Chemical Vapor Deposition).

Then, the amorphous silicon film 41 and the first layer 51 of the protective film 50 are formed by a same material in a same process by, for example, the plasma CVD method. The amorphous silicon film 41 is irradiated (annealed) with laser light LB using, for example, a solid-state laser to be crystallized.

Thereafter, the etch stopper layer 42 and the second layer 52 of the protective film 50 are formed by a same material in a same process, and are shaped into a predetermined form by etching, for example.

After the etch stopper layer 42 is formed, the n+ amorphous silicon film 43 of the above-described thickness is formed by, for example, a CVD method, and is shaped into a predetermined form by etching, for example.

After the n+ amorphous silicon film 43 is formed, the second wiring layer 30 is formed by film formation of a metallic layer made of the above-described material by, for example, a sputtering method, and shaping the metallic layer into a predetermined form by, for example, etching. The second insulating film 12 is further formed all over. Thus, the TFT substrate 1 having the pixel driving circuit 140 shown in FIGS. 1 to 8 is formed.

The open defect 61 and the like are repaired for the TFT substrate 1 by the above-described defect repairing method.

(Step of Forming Organic Light Emitting Elements 10R, 10G, and 10B)

After the TFT substrate 1 is formed, the film of the first electrode 71 made of the above-described material is formed by, for example, DC sputtering, and is selectively etched by using, for example, lithography technology to be patterned into a predetermined shape. Then, the interelectrode insulating film 72 of the thickness and material described above is formed by, for example, a CVD method, and an opening is formed by using, for example, lithography technology. Thereafter, the films of the organic layer 73 and the second electrode 74 of the materials described above are sequentially formed by, for example, a deposition method, so that the organic light emitting elements 10R, 10G, and 10B are formed. Then, the organic light emitting elements 10R, 10G, and 10B are covered with the protective layer 75 made of the above-described material.

The adhesive layer 80 is thereafter formed on the protective layer 75. Thereafter, the sealing substrate 81 provided with the color filter 82 and made of the above-described material is prepared, and the TFT substrate 1 and the sealing substrate 81 are laminated to each other with the adhesive layer 80 interposed therebetween. Thus, the display device shown in FIG. 21 is completed.

In this display device, when a predetermined voltage is applied between the first electrode 71 and the second electrode 74, a current is injected into the light emitting layer of the organic layer 73, and holes and electrons are recombined with each other to emit light. This light is extracted after passing through the second electrode 74, the protective layer 75, and the sealing substrate 81. In this case, because the display device is provided with the TFT substrate 1 according to the present embodiment, the open defect 61 or the open circuit 63 in the electrode 22 on the back surface side of the capacitor Cs, to which a connection type repair is inapplicable in related art, is surely repaired. Hence, high display quality is achieved.

Thus, in the present embodiment, the protective film 50 is provided at such a position as to enclose the corner part CN of the electrode 32 on the front surface side between the electrode 32 on the front surface side and the electrode 22 on the back surface side of the capacitor Cs, and the protective film 50 protects the electrode 22 on the back surface side when the electrode 32 on the front surface side is cut by being irradiated with laser light. Therefore, when the open defect 61 or the open circuit 63 occurs in the electrode 22 on the back surface side of the capacitor Cs, wiring 61B or 63B can be formed by a connection type repair with the electrode 22 on the back surface side which electrode 22 is present under the corner part CN as one terminal after the corner part CN of the electrode 32 on the front surface side is separated by cutting the electrode 32 on the front surface side at the position where the protective film 50 is present. Thus, a connection type repair can be made to even the open defect 61 or the open circuit 63 in the electrode 22 on the back surface side of the capacitor Cs, the open defect 61 or the open circuit 63 being difficult to repair completely in related art, so that a rate of performance of repairs can be improved. The present embodiment is very suitable for repairing defects in the pixel driving circuit 140 causing pixel dark dots, pixel bright dots or the like in particular, and high display quality can be achieved when a display device is formed using the TFT substrate 1. Further, the manufacturing yield of the TFT substrate 1 can be improved as a result of an improvement in the rate of performance of repairs.

Second Embodiment

Figure 22:
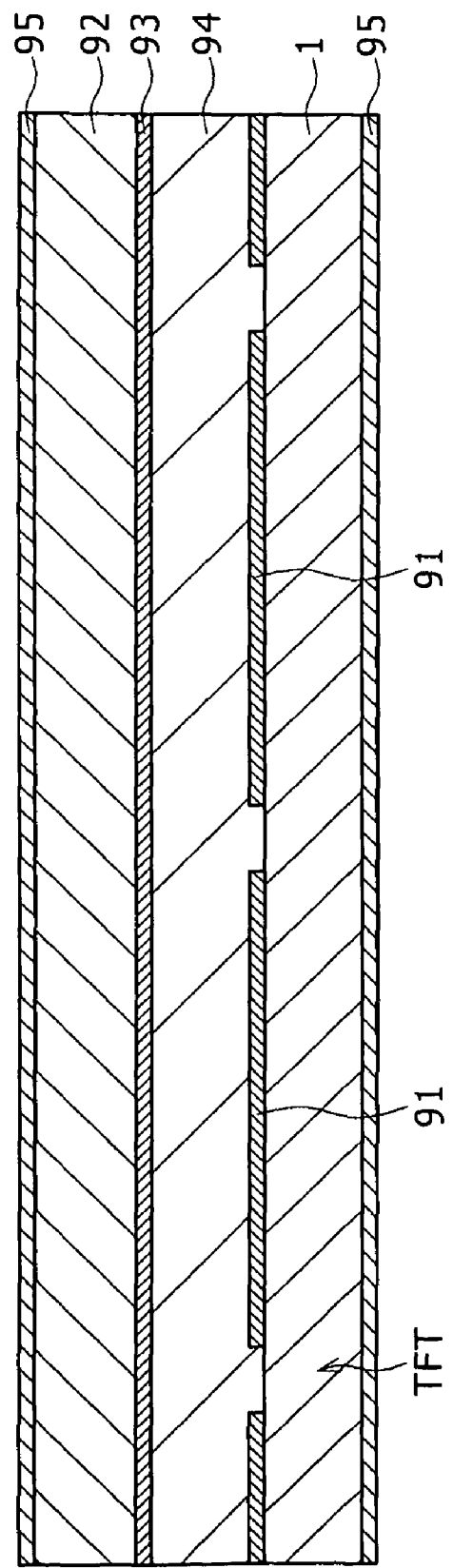
FIG. 22 is a sectional view of a configuration of a display device according to a second embodiment of the present invention.

FIG. 22 shows an example of a sectional constitution when the present invention is applied to a liquid crystal display device. The present embodiment is identical with the foregoing first embodiment except that display elements are formed by liquid crystal display elements, and action and effect of the present embodiment are also identical with those of the foregoing first embodiment. Thus, description will be made with corresponding constituent elements identified by the same reference numerals.

Though the constitution of the liquid crystal display elements is not particularly limited, for example, a pixel electrode 91 made of ITO (Indium Tin Oxide) is formed on a TFT substrate 1. A common electrode 93 made of ITO and formed on a counter substrate 92 made of glass or the like is disposed so as to face the pixel electrode 91, and a liquid crystal layer 94 is disposed between the pixel electrode 91 and the common electrode 93. A polarizer 95 is disposed on each of the TFT substrate 1 and the counter substrate 92 such that optical axes (not shown) of the polarizers 95 are orthogonal to each other.

(Module and Examples of Application)

Examples of application of the display devices described in the foregoing embodiments will be described below. The display devices according to the foregoing embodiments can be applied to display devices of electronic devices in all fields that display a video signal input thereto or a video signal generated therein as an image or video, such, for example, as television sets, digital cameras, notebook personal computers, portable terminal devices such as portable telephones and the like, or video cameras.

(Module)

Figure 23:
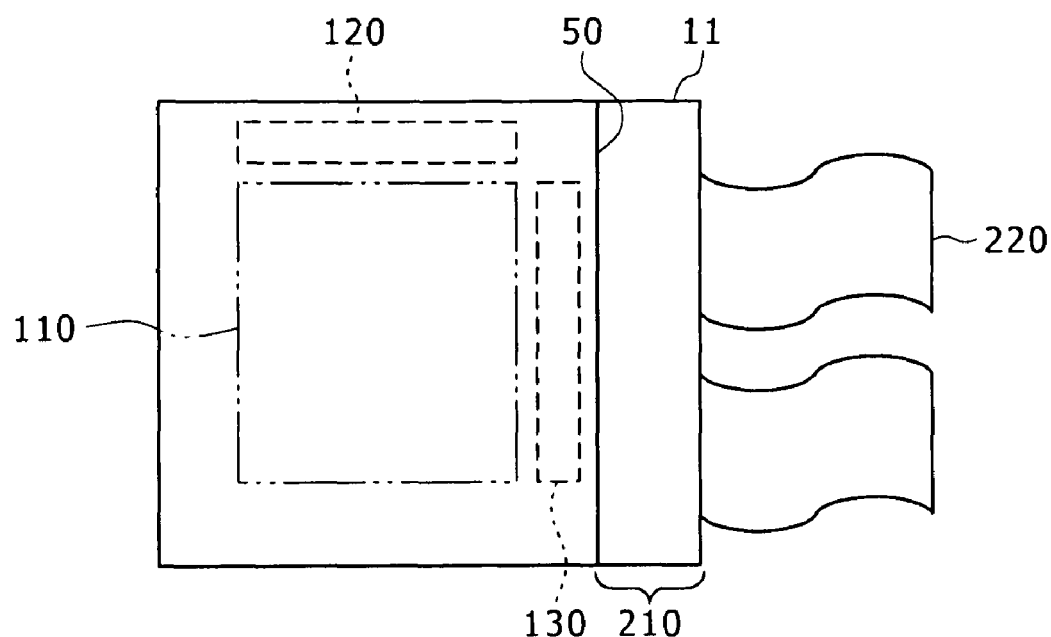
FIG. 23 is a plan view of a general constitution of a module including the display device according to the foregoing embodiment.

The display devices according to the foregoing embodiments are, for example, incorporated as a module as shown in FIG. 23 into various electronic devices according to a first to fifth example of application to be described later. This module, for example, has a region 210 exposed from a sealing substrate 50 and an adhesive layer 40 along one side of a substrate 11, and an external connection terminal (not shown) is formed in the exposed region 210 by extending wiring of a signal line driving circuit 120 and a scanning line driving circuit 130. The external connection terminal may be provided with a flexible printed circuit (FPC) 220 for inputting and outputting signals.

(First Example of Application)

Figure 24:
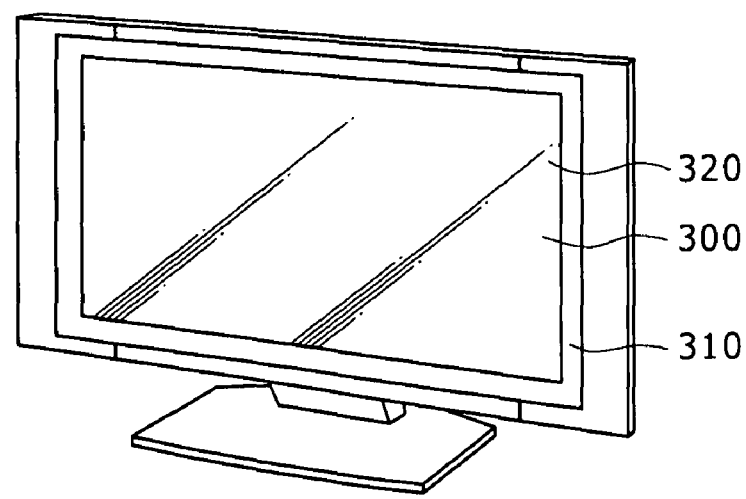
FIG. 24 is a perspective view of an external appearance of a first example of application of the display device according to the foregoing embodiment.

FIG. 24 shows an external appearance of a television set to which the display devices according to the foregoing embodiments are applied. The television set, for example, has a video display screen part 300 including a front panel 310 and a filter glass 320. The video display screen part 300 is formed by a display device according to each of the foregoing embodiments.

(Second Example of Application)

Figure 25A:
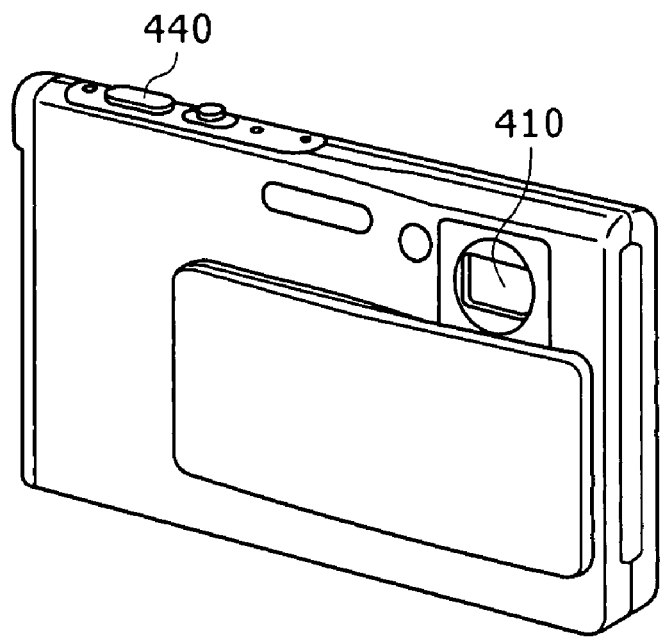
FIG. 25A is a perspective view of an external appearance of a second example of application as viewed from a front side.
Figure 25B:
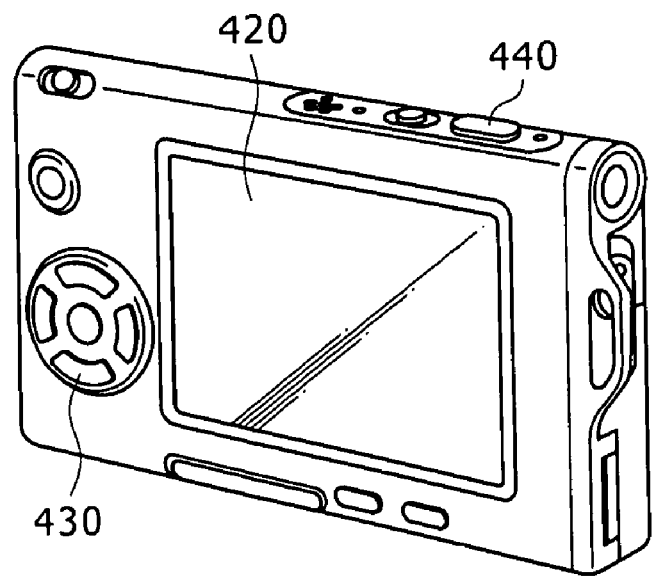
FIG. 25B is a perspective view of an external appearance of the second example of application as viewed from a back side.

FIGS. 25A and 25B show an external appearance of a digital camera to which the display devices according to the foregoing embodiments are applied. The digital camera, for example, has a light emitting part 410 for flashlight, a display part 420, a menu switch 430, and a shutter button 440. The display part 420 is formed by a display device according to each of the foregoing embodiments.

(Third Example of Application)

Figure 26:
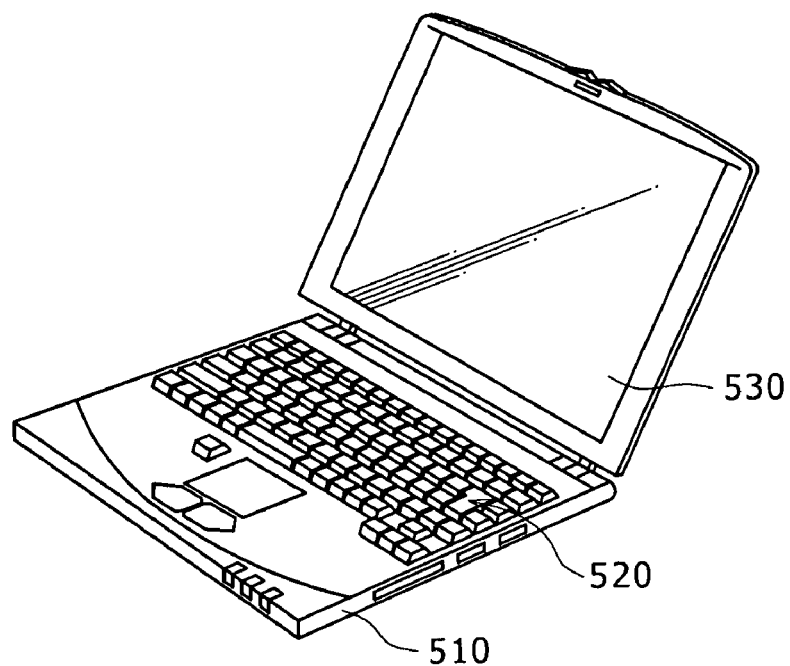
FIG. 26 is a perspective view of an external appearance of a third example of application.

FIG. 26 shows an external appearance of a notebook personal computer to which the display devices according to the foregoing embodiments are applied. The notebook personal computer, for example, has a main unit 510, a keyboard 520 operated to input characters and the like, and a display part 530 for displaying an image. The display part 530 is formed by a display device according to each of the foregoing embodiments.

(Fourth Example of Application)

Figure 27:
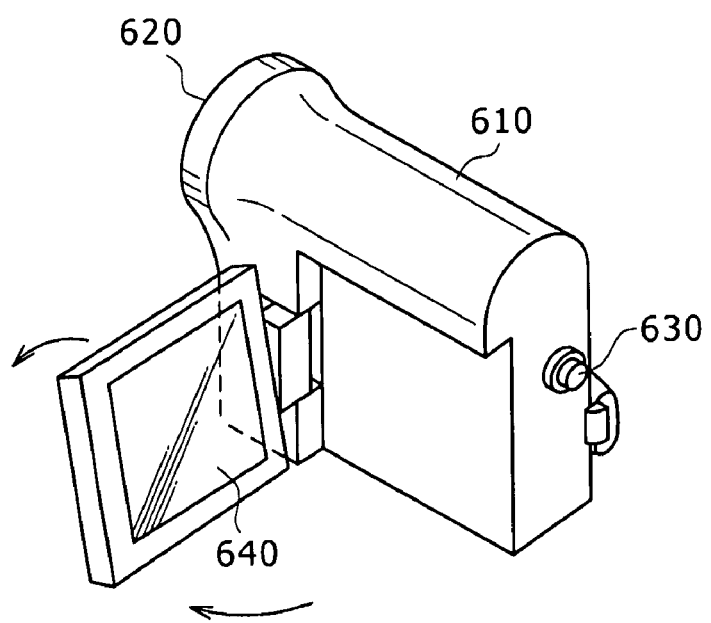
FIG. 27 is a perspective view of an external appearance of a fourth example of application.

FIG. 27 shows an external appearance of a video camera to which the display devices according to the foregoing embodiments are applied. The video camera, for example, has a main unit 610, a lens 620 for taking a subject which lens is provided in a front side surface of the main unit 610, a start/stop switch 630 at a time of picture taking, and a display part 640. The display part 640 is formed by a display device according to each of the foregoing embodiments.

(Fifth Example of Application)

FIGS. 28A to 28G show an external appearance of a portable telephone to which the display devices according to the foregoing embodiments are applied. The portable telephone is, for example, formed by coupling an upper side casing 710 and a lower side casing 720 with each other by a coupling part (a hinge part) 730, and has a display 740, a sub-display 750, a picture light 760, and a camera 770. The display 740 and the sub-display 750 are formed by a display device according to each of the foregoing embodiments.

Figure 29:
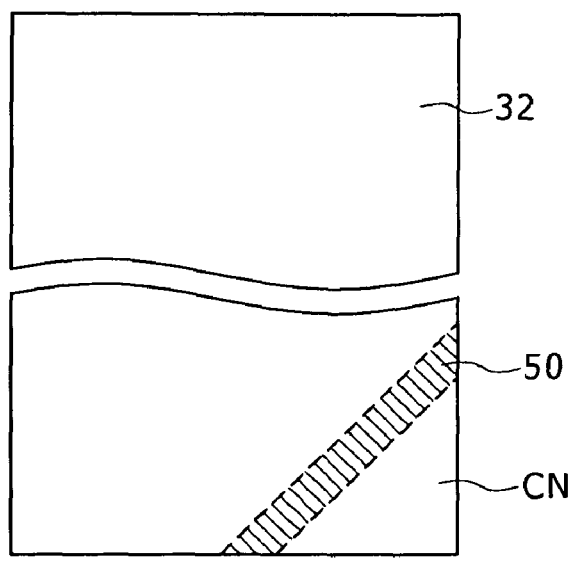
FIG. 29 is a plan view of an example of modification of a protective film shown in FIG. 6.

While the present invention has been described above by citing embodiments, the present invention is not limited to the foregoing embodiments, but is susceptible of various modifications. For example, in the foregoing embodiment, description has been made of a case where the electrode 32 on the front surface side and the electrode 22 on the back surface side of the capacitor Cs are formed into a rectangular shape, the protective film 50 is formed in the shape of an L at a corner of the electrode 32 on the front surface side, and the corner part CN is formed into a rectangular shape (for example a square). However, the protective film 50 may be of another shape, and is not particularly limited. For example, as shown in FIG. 29, the protective film 50 may be formed into the shape of a straight line, and the corner part CN may be formed into a rectangle. When the protective film 50 is formed into the shape of an L, effect of the protective film 50 on the capacitance of the capacitor Cs can be reduced. When the protective film 50 is formed into the shape of a straight line, the number of machining steps of a cut type repair, which number is two in the case of the shape of an L when the electrode 32 on the front surface side is cut (see FIG. 10 in the first example), can be reduced to one.

Figure 30:
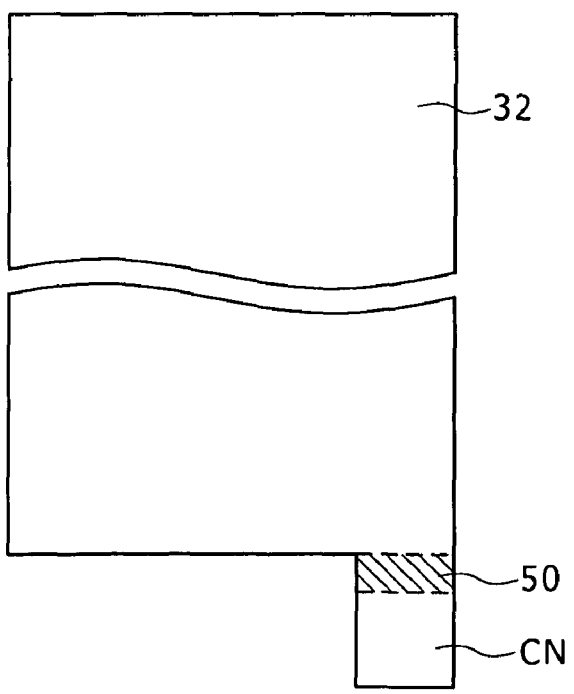
FIG. 30 is a plan view of another example of modification of the protective film shown in FIG. 6.

In addition, as shown in FIG. 30, for example, the corner part CN may be a part projecting from the electrode 32 on the front surface side and the electrode 22 on the back surface side of the capacitor Cs, and the protective film 50 may be formed in the shape of a straight line at the basal position of the corner part CN. Then, the circumferential length per unit capacitance of the electrode 32 on the front surface side and the electrode 22 on the back surface side is increased, and may thus raise the probability of occurrence of a same-layer short, whereas as advantages, it is possible to reduce effect of the protective film 50 on the capacitance of the capacitor Cs and reduce the number of times of machining of a cut type repair to one. Among these various forms, one that contributes to an improvement in performance of the TFT substrate or an improvement in productivity can be selected in consideration of the pattern shape, arrangement or the like of other circuit elements.

Further, for example, the material and thickness or the film forming method, film forming conditions and the like of each layer described in the foregoing embodiments are not limited; each layer may be of another material and another thickness, or another film forming method and other film forming conditions may be adopted.

In addition, in the foregoing embodiments, the constitution of the organic light emitting elements 10R, 10G, and 10B has been described concretely. However, the organic light emitting elements 10R, 10G, and 10B do not need to have all the layers, and may further include another layer.

Further, the present invention is applicable to display devices using not only organic light emitting elements and liquid crystal display elements but also other display elements such as inorganic electroluminescent elements, electrodeposition type or electrochromic type display elements, or the like.

It should be understood by those skilled in the art that various modifications, combinations, sub-combinations and alterations may occur depending on design requirements and other factors insofar as they are within the scope of the appended claims or the equivalents thereof.

What is claimed is:

1. A thin film transistor substrate comprising:
a substrate;
a thin film transistor and a capacitor formed on said substrate; and
a protective film for protecting an electrode on a back surface side of said capacitor when laser light is incident on an electrode on a front surface side of said capacitor, the protective film being disposed at such a position as to enclose a corner part of said electrode on the front surface side between said electrode on the front surface side and said electrode on the back surface side of said capacitor,
wherein said protective film has a laminated structure of two layers or more including a layer capable of absorbing laser light.

2. The thin film transistor substrate according to claim 1, wherein
said thin film transistor is an etch stopper type thin film transistor having a semiconductor layer and an etch stopper layer above a gate electrode, and
said laminated structure comprises a first layer made of a same material as said semiconductor layer, said first layer being the layer capable of absorbing laser light, and a second layer made of a same material as said etch stopper layer.

3. A thin film transistor substrate comprising:
a substrate;
a thin film transistor and a capacitor formed on said substrate; and
a protective film for protecting an electrode on a back surface side of said capacitor when laser light is incident on an electrode on a front surface side of said capacitor, the protective film being disposed at such a position as to enclose a corner part of said electrode on the front surface side between said electrode on the front surface side and said electrode on the back surface side of said capacitor,
wherein said protective film is disposed on an insulating film between said electrode on the front surface side and said electrode on the back surface side, and is covered with said electrode on the front surface side.

4. A display device comprising:
a display element on a thin film transistor substrate, wherein said thin film transistor substrate includes
a substrate,
a thin film transistor and a capacitor formed on said substrate, and
a protective film for protecting an electrode on a back surface side of said capacitor when laser light is incident on an electrode on a front surface side of said capacitor, the protective film being disposed at such a position as to enclose a corner part of said electrode on the front surface side between said electrode on the front surface side and said electrode on the back surface side of said capacitor,
wherein said protective film has a laminated structure of two layers or more including a layer capable of absorbing laser light.

5. The display device according to claim 4, wherein
said thin film transistor is an etch stopper type thin film transistor having a semiconductor layer and an etch stopper layer above a gate electrode, and
said laminated structure comprises a first layer made of a same material as said semiconductor layer, said first layer being the layer capable of absorbing laser light, and a second layer made of a same material as said etch stopper layer.

6. A display device comprising:
a display element on a thin film transistor substrate, wherein said thin film transistor substrate includes
a substrate;
a thin film transistor and a capacitor formed on said substrate; and
a protective film for protecting an electrode on a back surface side of said capacitor when laser light is incident on an electrode on a front surface side of said capacitor, the protective film being disposed at such a position as to enclose a corner part of said electrode on the front surface side between said electrode on the front surface side and said electrode on the back surface side of said capacitor,
wherein said protective film is disposed on an insulating film between said electrode on the front surface side and said electrode on the back surface side, and is covered with said electrode on the front surface side.

* * * * *